United States Patent
Vo et al.

(10) Patent No.: US 11,594,272 B2
(45) Date of Patent: Feb. 28, 2023

(54) SENSING A MEMORY CELL

(71) Applicant: Micron Technology, Inc., Boise, ID (US)

(72) Inventors: Huy T. Vo, Boise, ID (US); Adam S. El-Mansouri, Boise, ID (US); Suryanarayana B. Tatapudi, Boise, ID (US); John D. Porter, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/409,608

(22) Filed: Aug. 23, 2021

(65) Prior Publication Data

US 2021/0383856 A1  Dec. 9, 2021

Related U.S. Application Data

(62) Division of application No. 15/962,938, filed on Apr. 25, 2018, now Pat. No. 11,127,449.

(51) Int. Cl.
*G11C 11/22* (2006.01)

(52) U.S. Cl.
CPC ........ *G11C 11/2273* (2013.01); *G11C 11/221* (2013.01); *G11C 11/2255* (2013.01); *G11C 11/2257* (2013.01)

(58) Field of Classification Search
CPC ................................ G11C 16/26; G11C 11/22
USPC .......................................................... 365/145
See application file for complete search history.

(56) References Cited

U.S. PATENT DOCUMENTS

| | | | |
|---|---|---|---|
| 5,095,461 A | 3/1992 | Miyakawa et al. |
| 6,031,754 A | 2/2000 | Derbenwick et al. |
| 6,118,688 A | 9/2000 | Hirano et al. |
| 6,154,402 A | 11/2000 | Akita |
| 6,154,404 A | 11/2000 | Hwang |

(Continued)

FOREIGN PATENT DOCUMENTS

| CN | 101656101 A | 2/2010 |
|---|---|---|
| CN | 103578534 A | 2/2014 |

(Continued)

OTHER PUBLICATIONS

ISA/KR, International Search Report and Written Opinion of the International Searching Authority, Int'l. Appl. No. PCT/US2019/025379, dated Jul. 19, 2019, Korean Intellectual Property Office, Seo-gu, Daejeon, Republic of Korea, 9 pgs.

(Continued)

*Primary Examiner* — Muna A Techane
(74) *Attorney, Agent, or Firm* — Holland & Hart LLP

(57) ABSTRACT

Devices and methods for sensing a memory cell are described. The memory cell may include a ferroelectric memory cell. During a read operation, a first switching component may selectively couple a sense component with the memory cell based on a logic state stored on the memory cell to transfer a charge between the memory cell and the sense component. A second switching component, which may be coupled with the first switching component, may down convert a voltage associated with the charge to another voltage that is within an operation voltage of the sense component. The sense component may operate at a lower voltage than a voltage at which the memory cell operates to reduce power consumption in some cases.

20 Claims, 8 Drawing Sheets

(56) References Cited

U.S. PATENT DOCUMENTS

| | | | |
|---|---|---|---|
| 6,480,433 B2 | 11/2002 | Huffman | |
| 6,487,104 B2 | 11/2002 | Takashima | |
| 6,594,174 B2 | 7/2003 | Choi et al. | |
| 6,999,345 B1 | 2/2006 | Park et al. | |
| 7,016,216 B2 | 3/2006 | Oikawa et al. | |
| 7,366,004 B2 | 4/2008 | Miyamoto et al. | |
| 7,881,090 B2* | 2/2011 | Park | G11C 15/04 365/49.1 |
| 8,199,559 B2 | 6/2012 | Kajigaya | |
| 8,228,707 B2 | 7/2012 | Nishimura et al. | |
| 8,238,183 B2 | 8/2012 | Yoshida et al. | |
| 8,369,134 B2* | 2/2013 | Singh | G11C 11/412 365/189.04 |
| 9,530,513 B1* | 12/2016 | Pan | G11C 11/5642 |
| 9,886,991 B1 | 2/2018 | Vimercati et al. | |
| 2004/0062116 A1 | 4/2004 | Takano et al. | |
| 2005/0024967 A1 | 2/2005 | Matsuoka | |
| 2005/0104627 A1 | 5/2005 | Song et al. | |
| 2006/0158946 A1* | 7/2006 | Taddeo | G11C 7/14 365/208 |
| 2008/0158932 A1* | 7/2008 | Khellah | G11C 11/413 365/72 |
| 2009/0257298 A1 | 10/2009 | Kajigaya et al. | |
| 2010/0046306 A1* | 2/2010 | Takahashi | G11C 7/12 365/207 |
| 2010/0128545 A1 | 5/2010 | Lee et al. | |
| 2011/0063881 A1 | 3/2011 | Dabak et al. | |
| 2011/0075480 A1 | 3/2011 | Cernea | |
| 2011/0261631 A1 | 10/2011 | Yoshida et al. | |
| 2011/0305061 A1 | 12/2011 | Evans | |
| 2012/0281470 A1 | 11/2012 | Fukuda | |
| 2014/0029326 A1 | 1/2014 | Qidwai | |
| 2014/0043928 A1* | 2/2014 | Lee | G11C 7/067 365/208 |
| 2015/0085566 A1* | 3/2015 | Jain | G11C 8/08 365/230.03 |
| 2017/0117025 A1 | 4/2017 | Lee | |
| 2017/0287541 A1 | 10/2017 | Vimercati | |
| 2017/0316833 A1 | 11/2017 | Ihm et al. | |
| 2019/0333565 A1 | 10/2019 | Marotta et al. | |

FOREIGN PATENT DOCUMENTS

| | | |
|---|---|---|
| CN | 107636763 A | 1/2018 |
| JP | 2006202421 A | 8/2006 |
| JP | 2010073299 A | 4/2010 |
| TW | 201802805 A | 1/2018 |
| TW | 201805945 A | 2/2018 |
| WO | 2017209858 A1 | 12/2017 |

OTHER PUBLICATIONS

IPO, "Office Action," issued in connection with ROC (Taiwan) Patent Application No. 108112070, dated Dec. 3, 2019 (8 pages).

China National Intellectual Property Administration, "First Office Action," and "First Search" issued in connection with Chinese Patent Application No. 201980027262.8, dated Apr. 16, 2021 (23 pages with Translation).

The Korean Intellectual Property Office, "Notice of Reasons for Rejection," issued in connection with Korea Patent Application No. 10-2020-7033778, dated Sep. 1, 2021 (4 pages).

Japan Patent Office, "Decision to Grant," issued in connection with Japan Patent Application No. 2020-558979, dated Nov. 2, 2021 (2 pages).

European Search Report and Search Opinion received for EP Application No. 19792183.6, dated Jan. 10, 2022, 8 pages.

Chinese Patent Office, "Office Action and Search Report", issued in connection with Chinese Patent Application No. 201910339063.2 dated Sep. 8, 2022 (10 pages).

* cited by examiner

SENSING A MEMORY CELL

CROSS REFERENCE

The present Application for Patent is a divisional of U.S. patent application Ser. No. 15/962,938 by Vo et al., entitled "SENSING A MEMORY CELL," filed Apr. 25, 2018, assigned to the assignee hereof, and is expressly incorporated by reference in its entirety herein.

BACKGROUND

The following relates generally to operating a memory array and more specifically to sensing a memory cell.

Memory devices are widely used to store information in various electronic devices such as computers, wireless communication devices, cameras, digital displays, and the like. Information is stored by programing different states of a memory device. For example, binary devices have two states, often denoted by a logic "1" or a logic "0." In other systems, more than two states may be stored. To access the stored information, a component of the electronic device may read, or sense, the stored state in the memory device. To store information, a component of the electronic device may write, or program, the state in the memory device.

Various types of memory devices exist, including magnetic hard disks, random access memory (RAM), read only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), and others. Memory devices may be volatile or non-volatile. Non-volatile memory, e.g., FeRAM, may maintain their stored logic state for extended periods of time even in the absence of an external power source. Volatile memory devices, e.g., DRAM, may lose their stored state over time unless they are periodically refreshed by an external power source. FeRAM may use similar device architectures as volatile memory but may have non-volatile properties due to the use of a ferroelectric capacitor as a storage device. FeRAM devices may thus have improved performance compared to other non-volatile and volatile memory devices.

Improving memory devices, generally, may include increasing the memory cell density, increasing read/write speeds, increasing reliability, increasing data retention, reducing power consumption, or reducing manufacturing costs, among other metrics. Improving an efficiency (e.g., less power consumption, improved sense margin) of a sensing component of memory devices may also be desired.

DETAILED DESCRIPTION

Figure 1:
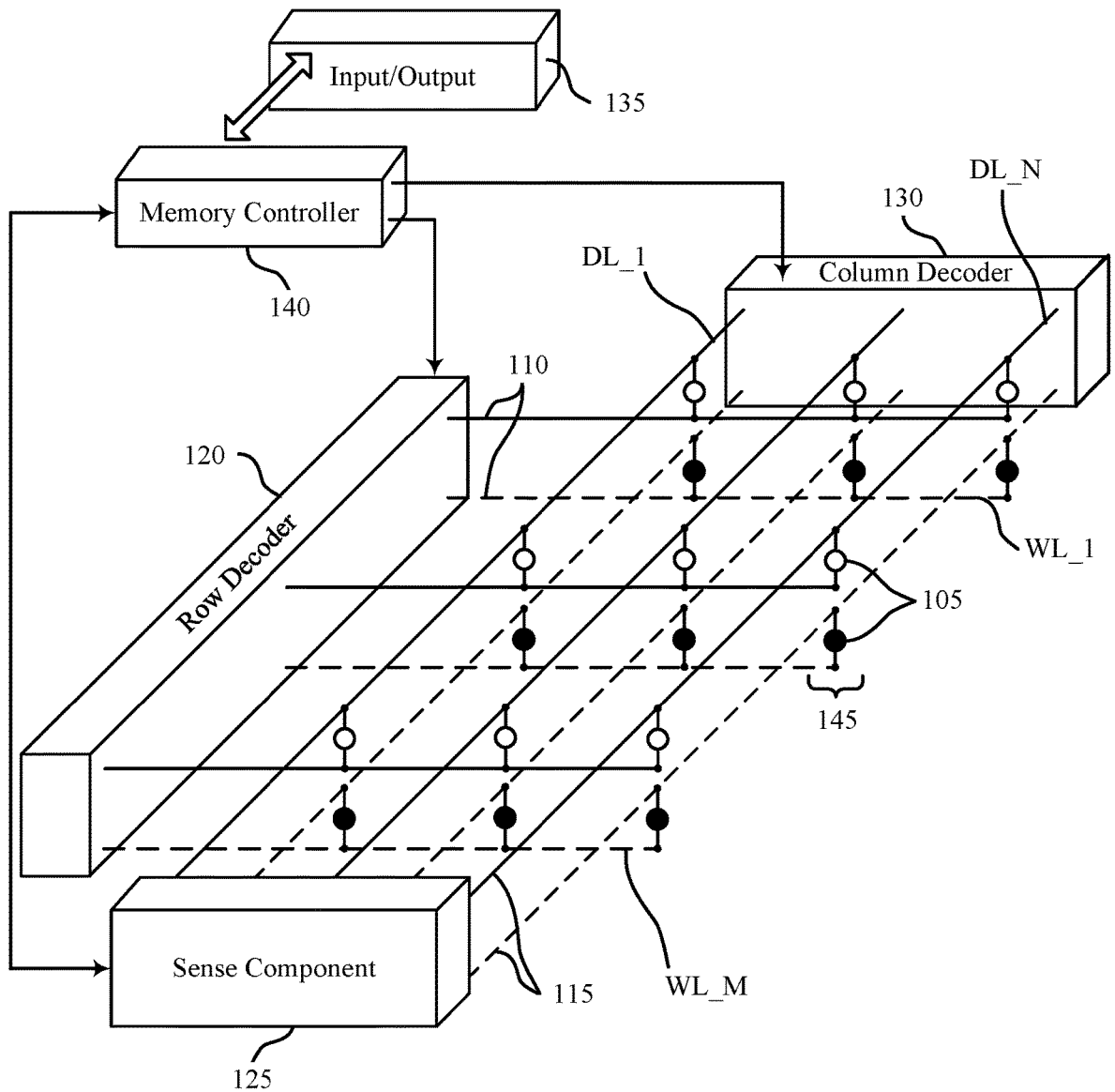
FIG. 1 illustrates an example of a memory array that supports sensing a memory cell in accordance with aspects of the present disclosure.

In some memory devices, an operation voltage of a memory cell may be determined to leverage electrical properties of a material (e.g., a ferroelectric material) used in the memory cell to store information. In some cases, the operation voltage of memory cell may be greater than another voltage at which periphery circuitry (e.g., a sense component) may operate. When a periphery circuitry is designed to support the greater operation voltage suitable for the memory cell, the periphery circuitry may have a larger power consumption, inferior sensing characteristics, or other less desirable aspects.

A circuit (e.g., a down-conversion circuit) and methods for sensing a memory cell using the circuit during an access operation (e.g. a read operation) are described herein. The circuit, for example a down-conversion circuit, may be configured to reduce a voltage or charge seen by a sense component during a read operation. When a down-conversion circuit is used, for example, the sense component may be configured to operate at a lower power than sense components where no down-conversion circuit is used. The down-conversion circuit may selectively couple a memory cell with a sensing component based on a logic state stored on the memory cell. In addition, the down-conversion circuit may limit (e.g., reduce, down convert) a voltage indicative of the logic state stored on the memory cell to a second voltage that is better for the sensing component. The down-conversion circuit may improve a sensing window of the sensing component during a read operation and may facilitate the sense component to operate at a desired operation voltage for an energy-efficient read operation.

In some cases, the down-conversion circuit may be positioned between a memory cell and a sensing component. The circuit may include T1 (e.g., a first switching component) and T2 (e.g., a second switching component) that may be arranged in a serial configuration. In some examples, T1 may be a p-type metal oxide semiconductor (PMOS) field effect transistor (FET) and T2 may be an n-type metal oxide semiconductor (NMOS) field effect transistor (FET). Further, T1 may be coupled with a node (e.g., a first node), and T2 may be coupled with T1 and the sense component, where a gate of T2 may be electrically connected to the node. During a read operation, the memory cell may be coupled with the node, and different voltages may be established at the node based on a logic state stored on the memory cell.

T1 of the down-conversion circuit may be configured to turn on (e.g., activate) when a first voltage appears at the node as a result of coupling the node with the memory cell. In some cases, the first voltage may correspond to a "high" logic state (e.g., logic state "1") stored on the memory cell. T1 may remain deactivated when a second voltage different than the first voltage appears at the node as a result of coupling the node with the memory cell. In some cases, the second voltage may correspond to a "low" logic state (e.g., logic state "0") stored on the memory cell. Such operation of T1 during the read operation may be accomplished using a threshold voltage of T1 and a voltage applied to a gate of T1 based on the circuit configuration described above. As such, T1 may selectively transfer a charge of the memory cell to the sense component during the read operation based on the charge indicative of a logic state of the memory cell 105-b presented at a node of the T1.

Additionally, T2 of the down-conversion circuit may be configured in a source follower configuration such that T2 may turn on (e.g., activate) to pass the first voltage at the node when the first voltage at the node (e.g., the voltage applied to a gate of T2) is greater than a threshold voltage of T2. Hence, T2 may limit (e.g., reduce, down convert) the first voltage at the node by T2's threshold voltage, and pass the reduced voltage to the sense component. As such, the first voltage at the node may be reduced to a voltage that is within an operation voltage of the sense component by selecting the threshold voltage of T2.

T1 may selectively activate to couple the memory cell (e.g., through the node) with the sense component based on a logic state stored on the memory cell—e.g., T1 may activate when the memory cell stores a "high" logic state (e.g., logic state "1") while T1 may remain deactivated when the memory cell stores a "low" logic state (e.g., logic state "0"). The voltage at the node may indicate the logic state of the memory cell during the read operation. In addition, when T1 is activated, T2 may limit (e.g., reduce, down convert) the voltage at the node to a reduced voltage that may be suitable for the sense component to operate with. Operation of the down-conversion circuit as described above may provide a more energy-efficient and reliable sensing operation due to a lower operation voltage of the sensing component as well as an improved sensing margin.

Features of the disclosure introduced above are further described below in the context of FIGS. 1 through 3. Specific examples are then described for FIGS. 4 through 5. These and other features of the disclosure are further illustrated by and described with reference to apparatus diagrams, system diagrams, and flowcharts that relate to sensing a memory cell.

FIG. 1 illustrates an example of a memory array 100 that supports sensing a memory cell in accordance with aspects of the present disclosure. FIG. 1 is an illustrative schematic representation of various components and features of the memory array 100. As such, it should be appreciated that the components and feature of the memory array 100 are shown to illustrate functional interrelationships, not their actual physical positions within the memory array 100. Memory array 100 may also be referred to as an electronic memory apparatus or device. Memory array 100 includes memory cells 105 that are programmable to store different states. In some cases, each memory cell 105 may be a ferroelectric memory cell that may include a capacitor with a ferroelectric material as the insulating material. In some cases, the capacitor may be referred to as a ferroelectric container. Each memory cell 105 may be programmable to store two states, denoted as a logic 0 and a logic 1. Each memory cell 105 may be stacked on top of each other resulting in two-decks of memory cell 145. Hence, the example in FIG. 1 may be an example that depicts two decks of memory array.

In some cases, memory cells 105 are configured to store more than two logic states. A memory cell 105 may store a charge representative of the programmable states in a capacitor; for example, a charged and uncharged capacitor may represent two logic states, respectively. A charge may represent an amount of charge present in or on a component or a conductor. In some cases, a charge may correspond to a logic state stored in a capacitor of a memory cell 105. In some cases, a charge may correspond to some other value and/or component. As used herein, a charge is not limited to a particular value carried by a single proton or electron.

DRAM architectures may commonly use such a design, and the capacitor employed may include a dielectric material with paraelectric or linear polarization properties as the insulator. By contrast, a ferroelectric memory cell may include a capacitor with a ferroelectric material as the insulating material. Different levels of charge of a ferroelectric capacitor may represent different logic states. Ferroelectric materials have non-linear polarization properties; some details and advantages of a ferroelectric memory cell 105 are discussed below.

Operations such as reading and writing, which may be referred to as access operations, may be performed on memory cells 105 by activating or selecting word line 110 and digit line 115. Word lines 110 may also be known as row lines, sense lines, and access lines. Digit lines 115 may also be known as bit lines, column lines, access lines. References to word lines and digit lines, or their analogues, are interchangeable without loss of understanding or operation. Word lines 110 and digit lines 115 may be perpendicular (or nearly perpendicular) to one another to create an array. Depending on the type of memory cell (e.g., FeRAM, RRAM), other access lines may be present, such as plate lines, for example. It should be appreciated that the exact operation of the memory device may be altered based on the type of memory cell and/or the specific access lines used in the memory device.

Activating or selecting a word line 110 or a digit line 115 may include applying a voltage to the respective line. Word lines 110 and digit lines 115 may be made of conductive materials such as metals (e.g., copper (Cu), aluminum (Al), gold (Au), tungsten (W)), metal alloys, carbon, conductively-doped semiconductors, or other conductive materials, alloys, compounds, or the like.

Memory array 100 may be a two-dimensional (2D) memory array or a three-dimensional (3D) memory array. A 3D memory array may include 2D memory arrays formed on top of one another. This may increase the number of memory cells that may be placed or created on a single die or substrate as compared with 2D arrays, which in turn may reduce production costs or increase the performance of the memory array, or both. Memory array 100 may include any number of levels. Each level may be aligned or positioned so that memory cells 105 may be approximately aligned with one another across each level. Each row of memory cells 105 may be connected to a single word line 110, and each column of memory cells 105 is connected to a single digit line 115. By activating one word line 110 and one digit line 115 (e.g., applying a voltage to the word line 110 or digit line 115), a single memory cell 105 may be accessed at their intersection. Accessing the memory cell 105 may include reading or writing the memory cell 105. The intersection of a word line 110 and digit line 115 may be referred to as an address of a memory cell.

In some architectures, the logic storing device of a cell, e.g., a capacitor, may be electrically isolated from the digit line by a selector device. The word line 110 may be connected to and may control the selector device. For example, the selector device may be a transistor (e.g., thin-film transistor (TFT)) and the word line 110 may be connected to the gate of the transistor. Activating the word line 110 results in an electrical connection or closed circuit between the capacitor of a memory cell 105 and its corresponding digit line 115. The digit line may then be accessed to either read or write the memory cell 105. In addition, as described below in FIG. 2, access operation of ferroelectric memory cells may need an additional connection to a node of the ferroelectric memory cell, namely cell plate node via plate line. In some cases, a digit line 115 may be precharged during a read operation. Subsequently, a word line 110 may be activated to couple a memory cell 105 with the digit line 115 after precharging the digit line 115. In some cases, a charge may be transferred between the memory cell 105 and a sense component (e.g., sense component 125) through a circuit configured to reduce a voltage associated with the charge during the read operation based on activating the word line 110. In some cases, a logic state stored on the memory cell 105 may be determined based on the charge transferred through the circuit.

Accessing the memory cells 105 may be controlled through a row decoder 120 and a column decoder 130. For example, a row decoder 120 may receive a row address from the memory controller 140 and activate the appropriate word line 110 based on the received row address. Similarly, a column decoder 130 receives a column address from the memory controller 140 and activates the appropriate digit line 115. For example, memory array 100 may include multiple word lines 110, labeled WL_1 through WL_M, and multiple digit lines 115, labeled DL_1 through DL_N, where M and N depend on the array size. Thus, by activating a word line 110 and a digit line 115, e.g., WL_2 and DL_3, the memory cell 105 at their intersection may be accessed. In addition, access operation of ferroelectric memory cells may need to activate a corresponding plate line for the memory cell 105, associated with plate line decoder.

Upon accessing, a memory cell 105 may be read, or sensed, by sense component 125 to determine the stored state of the memory cell 105. For example, after accessing the memory cell 105, the ferroelectric capacitor of memory cell 105 may discharge onto its corresponding digit line 115. Discharging the ferroelectric capacitor may result from biasing, or applying a voltage, to the ferroelectric capacitor. The discharging may cause a change in the voltage of the digit line 115, which sense component 125 may compare to a reference voltage in order to determine the stored state of the memory cell 105. For example, if digit line 115 has a higher voltage than the reference voltage, then sense component 125 may determine that the stored state in memory cell 105 was a logic 1 and vice versa. Sense component 125 may include various transistors or amplifiers in order to detect and amplify a difference in the signals, which may be referred to as latching. The detected logic state of memory cell 105 may then be output through column decoder 130 as output 135. In some cases, sense component 125 may be part of a column decoder 130 or row decoder 120. Or, sense component 125 may be connected to or in electronic communication with column decoder 130 or row decoder 120.

In some cases, a circuit may be positioned between a memory cell 105 and a sense component 125. The circuit may be configured to selectively couple the sense component 125 with the memory cell 105 during a read operation and to selectively down-convert a signal received from the memory cell 105 during the read operation. A first switching component of the circuit may selectively couple the sense component 125 with the memory cell 105 to transfer a charge between them based on a logic state stored on the memory cell 105 for certain logic states stored on the memory cell 105. In addition, a second switching component of the circuit may reduce a voltage associated with the charge for the sense component 125 during the read operation for certain logic states stored on the memory cell 105.

A memory cell 105 may be set, or written, by similarly activating the relevant word line 110 and digit line 115—i.e., a logic value may be stored in the memory cell 105. Column decoder 130 or row decoder 120 may accept data, for example input/output 135, to be written to the memory cells 105. A ferroelectric memory cell 105 may be written by applying a voltage across the ferroelectric capacitor. This process is discussed in more detail below.

In some memory architectures, accessing the memory cell 105 may degrade or destroy the stored logic state and re-write or refresh operations may be performed to return the original logic state to memory cell 105. In DRAM, for example, the capacitor may be partially or completely discharged during a sense operation, corrupting the stored logic state. So the logic state may be re-written after a sense operation. Additionally, activating a single word line 110 may result in the discharge of all memory cells in the row; thus, several or all memory cells 105 in the row may need to be re-written.

In some memory architectures, including DRAM, memory cells may lose their stored state over time unless they are periodically refreshed by an external power source. For example, a charged capacitor may become discharged over time through leakage currents, resulting in the loss of the stored information. The refresh rate of these so-called volatile memory devices may be relatively high, e.g., tens of refresh operations per second for DRAM arrays, which may result in significant power consumption. With increasingly larger memory arrays, increased power consumption may inhibit the deployment or operation of memory arrays (e.g., power supplies, heat generation, material limits), especially for mobile devices that rely on a finite power source, such as a battery. As discussed below, ferroelectric memory cells 105 may have beneficial properties that may result in improved performance relative to other memory architectures.

The memory controller 140 may control the operation (e.g., read, write, re-write, refresh, discharge) of memory cells 105 through the various components, for example, row decoder 120, column decoder 130, and sense component 125. In some cases, one or more of the row decoder 120, column decoder 130, and sense component 125 may be co-located with the memory controller 140. Memory controller 140 may generate row and column address signals in order to activate the desired word line 110 and digit line 115. Memory controller 140 may also generate and control various voltages or currents used during the operation of memory array 100. For example, it may apply discharge voltages to a word line 110 or digit line 115 after accessing one or more memory cells 105.

In some cases, the memory controller 140 may control various phases of a read operation. In some cases, the memory controller 140 may control timings associated with precharging a selected digit line 115 and activating a word line 110 to couple the memory cell 105 with the digit line 115 after precharging the digit line 115. In some cases, the memory controller 140 may control transferring a charge between the memory cell 105 and a sense component (e.g., sense component 125) through a circuit (e.g., a down-conversion circuit) configured to reduce a voltage associated with the charge transferred during the read operation. In some cases, the memory controller 140 may bias a gate of a first switching component of the circuit to a second voltage based on coupling the digit line to a first node. In some cases, the memory controller 140 may determine a logic state stored on the memory cell based on the charge transferred through the circuit.

In general, the amplitude, shape, or duration of an applied voltage or current discussed herein may be adjusted or varied and may be different for the various operations discussed in operating the memory array 100. Furthermore, one, multiple, or all memory cells 105 within memory array 100 may be accessed simultaneously; for example, multiple or all cells of memory array 100 may be accessed simultaneously during an access (or write or program) operation in which all memory cells 105, or a group of memory cells 105, are set or reset to a single logic state. It should be appreciated that the exact operation of the memory device may be altered based on the type of memory cell and/or the specific access lines used in the memory device. In some examples where other access lines e.g., plate lines, may be present, a corresponding plate line in collaboration with a word line and a digit line may need to be activated to access a certain memory cell 105 of the memory array. It should be appreciated that the exact operation of the memory device may vary based on the type of memory cell and/or the specific access lines used in the memory device.

Figure 2:
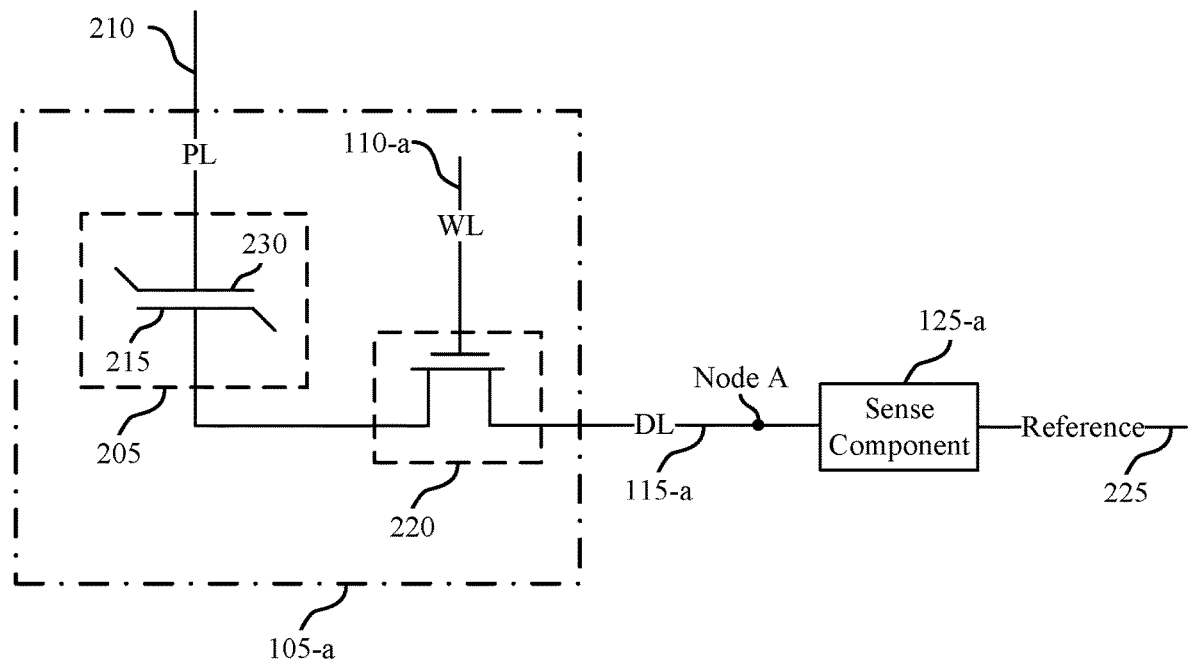
FIG. 2 illustrates an example of a circuit that supports techniques for sensing a memory cell in accordance with aspects of the present disclosure.

FIG. 2 illustrates an exemplary diagram 200 of a ferroelectric memory cell and circuit components that supports sensing a memory cell in accordance with aspects of the present disclosure. Circuit 200 includes a memory cell 105-a, word line 110-a, digit line 115-a, and sense component 125-a, which may be examples of a memory cell 105, word line 110, digit line 115, and sense component 125, respectively, as described with reference to FIG. 1. Memory cell 105-a may include a logic storage component, such as capacitor 205 that has a first plate, cell plate 230, and a second plate, cell bottom 215. Cell plate 230 and cell bottom 215 may be capacitively coupled through a ferroelectric material positioned between them. The orientation of cell plate 230 and cell bottom 215 may be flipped without changing the operation of memory cell 105-a. Circuit 200 also includes selector device 220 and reference line 225. Cell plate 230 may be accessed via plate line 210 and cell bottom 215 may be accessed via digit line 115-a. As described above, various states may be stored by charging or discharging the capacitor 205.

The stored state of capacitor 205 may be read or sensed by operating various elements represented in circuit 200. Capacitor 205 may be in electronic communication with digit line 115-a. For example, capacitor 205 can be isolated from digit line 115-a when selector device 220 is deactivated, and capacitor 205 can be connected to digit line 115-a when selector device 220 is activated. Activating selector device 220 may be referred to as selecting the memory cell 105-a. In some cases, selector device 220 is a transistor (e.g., thin-film transistor (TFT)) and its operation is controlled by applying a voltage to the transistor gate, where the voltage magnitude is greater than the threshold voltage magnitude of the transistor. Word line 110-a may activate the selector device 220; for example, a voltage applied to word line 110-a is applied to the transistor gate, connecting the capacitor 205 with digit line 115-a.

In some cases, digit line 115-a may be precharged during a read operation. Subsequently, word line 110-a may be biased to couple the memory cell 105-a with the precharged digit line 115-a. Coupling the memory cell 105-a with the precharged digit line 115-a may transfer a charge between memory cell 105-a and a first node (e.g., Node A) that is coupled with the precharged digit line 115-a. In some cases, a circuit (e.g., down-conversion circuit) configured to limit a voltage of the charge may be positioned between the first node and sense component 125-a. In some cases, the circuit includes a first switching component coupled with the first node and a second switching component coupled with the first switching component and sense component 125-a, where a gate of the second switching component is electrically connected to the first node. In some cases, the first switching component of the circuit is configured to selectively couple the sense component 125-a with the first node based on the memory cell transferring a first charge indicative of a high logic state to the first node. In some cases, the second switching component of the circuit is configured to reduce the voltage associated with the first charge for the sense component during the read operation.

In other examples, the positions of selector device 220 and capacitor 205 may be switched, such that selector device 220 is connected between plate line 210 and cell plate 230 and such that capacitor 205 is between digit line 115-a and the other terminal of selector device 220. In this example, selector device 220 may remain in electronic communication with digit line 115-a through capacitor 205. This configuration may be associated with alternative timing and biasing for read and write operations.

Due to the ferroelectric material between the plates of capacitor 205, and as discussed in more detail below, capacitor 205 may not discharge upon connection to digit line 115-a. In one scheme, to sense the logic state stored by ferroelectric capacitor 205, word line 110-a may be biased to select memory cell 105-a and a voltage may be applied to plate line 210. In some cases, digit line 115-a is virtually grounded and then isolated from the virtual ground, which may be referred to as "floating," prior to biasing the plate line 210 and word line 110-a. Biasing the plate line 210 may result in a voltage difference (e.g., plate line 210 voltage minus digit line 115-a voltage) across capacitor 205. The voltage difference may yield a change in the stored charge on capacitor 205, where the magnitude of the change in stored charge may depend on the initial state of capacitor 205—e.g., whether the initial state stored a logic 1 or a logic 0. This may cause a change in the voltage of digit line 115-a based on the charge stored on capacitor 205. Operation of memory cell 105-a by varying the voltage to cell plate 230 may be referred to as "moving cell plate."

The change in voltage of digit line 115-a may depend on its intrinsic capacitance. That is, as charge flows through digit line 115-a, some finite charge may be stored in digit line 115-a and the resulting voltage may depend on the intrinsic capacitance. The intrinsic capacitance may depend on physical characteristics, including the dimensions, of digit line 115-a. Digit line 115-a may connect many memory cells 105 so digit line 115-a may have a length that results in a non-negligible capacitance (e.g., on the order of picofarads (pF)). The resulting voltage of digit line 115-a may then be compared to a reference (e.g., a voltage of reference line 225) by sense component 125-a in order to determine the stored logic state in memory cell 105-a. Other sensing processes may be used.

Sense component 125-a may include various transistors or amplifiers to detect and amplify a difference in signals, which may be referred to as latching. Sense component 125-a may include a sense amplifier that receives and compares the voltage of digit line 115-a and reference line 225, which may be a reference voltage. The sense amplifier output may be driven to the higher (e.g., a positive) or lower (e.g., negative or ground) supply voltage based on the comparison. For instance, if digit line 115-a has a higher voltage than reference line 225, then the sense amplifier output may be driven to a positive supply voltage. In some cases, the sense amplifier may additionally drive digit line 115-a to the supply voltage. Sense component 125-a may then latch the output of the sense amplifier and/or the voltage of digit line 115-a, which may be used to determine the stored state in memory cell 105-a, e.g., logic 1. Alternatively, if digit line 115-a has a lower voltage than reference line 225, the sense amplifier output may be driven to a negative or ground voltage. Sense component 125-a may similarly latch the sense amplifier output to determine the stored state in memory cell 105-a, e.g., logic 0. The latched logic state of memory cell 105-a may then be output, for example, through column decoder 130 as output 135 with reference to FIG. 1.

In some cases, sense component 125-a may be configured to operate at a first voltage that is lower than a second voltage associated with the memory cell 105-a. For example, the memory cell 105-a may be configured to develop a signal on a node A during a read operation that is greater than the first voltage. A lower operating voltage may facilitate using a thinner gate oxide for various transistors or amplifiers of sense component 125-a. Transistors or amplifiers employing a thinner gate oxide may provide a simpler sensing operation (e.g., due to a better matching characteristics between a sensing node and a reference node) in addition to less power consumption. Furthermore, a lower operating voltage may facilitate scaling of an area occupied by sense component 125-a by reducing lateral physical dimensions (e.g., a gate length of a transistor, a space for isolation) associated with laying out various circuit components as compared to various sense components that are configured to operate at the second voltage associated with the memory cell 105-a.

To write memory cell 105-a, a voltage may be applied across capacitor 205. Various methods may be used. In one example, selector device 220 may be activated through word line 110-a in order to electrically connect capacitor 205 to digit line 115-a. A voltage may be applied across capacitor 205 by controlling the voltage of cell plate 230 (through plate line 210) and cell bottom 215 (through digit line 115-a). To write a logic 0, cell plate 230 may be taken high, that is, a positive voltage may be applied to plate line 210, and cell bottom 215 may be taken low, e.g., virtually grounding or applying a negative voltage to digit line 115-a. The opposite process is performed to write a logic 1, where cell plate 230 is taken low and cell bottom 215 is taken high.

Figure 3:
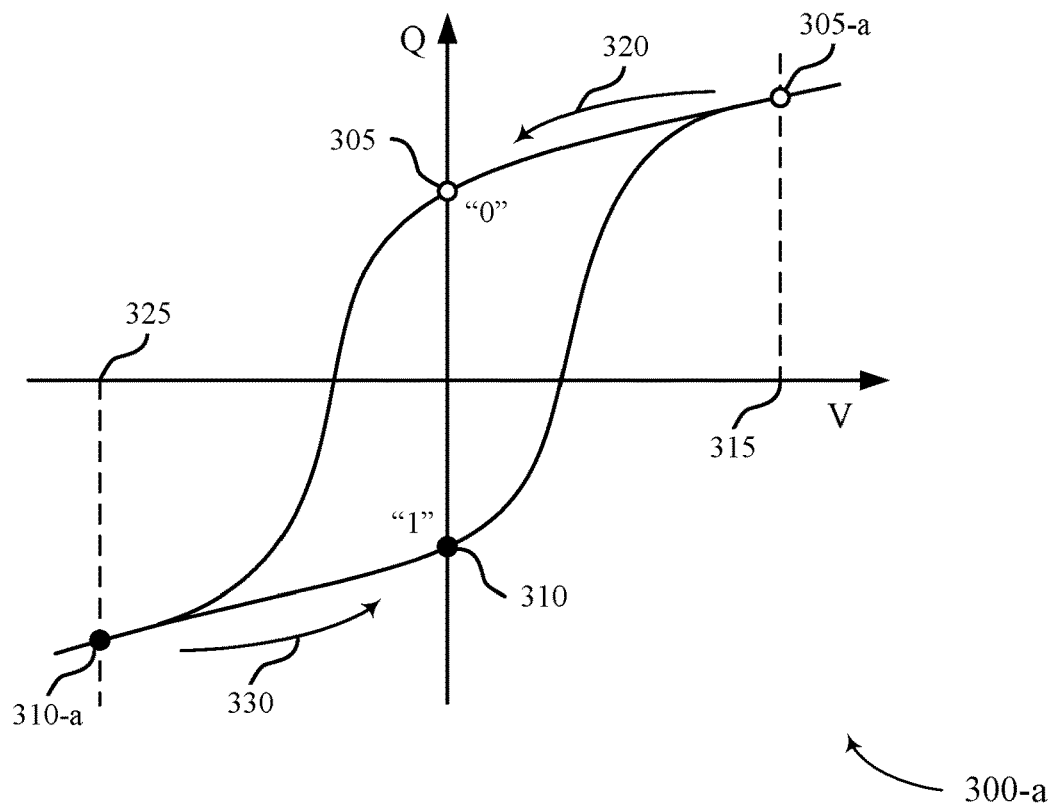
FIG. 3 illustrates an example of hysteresis curves that support sensing a memory cell in accordance with aspects of the present disclosure.
Figure 3:
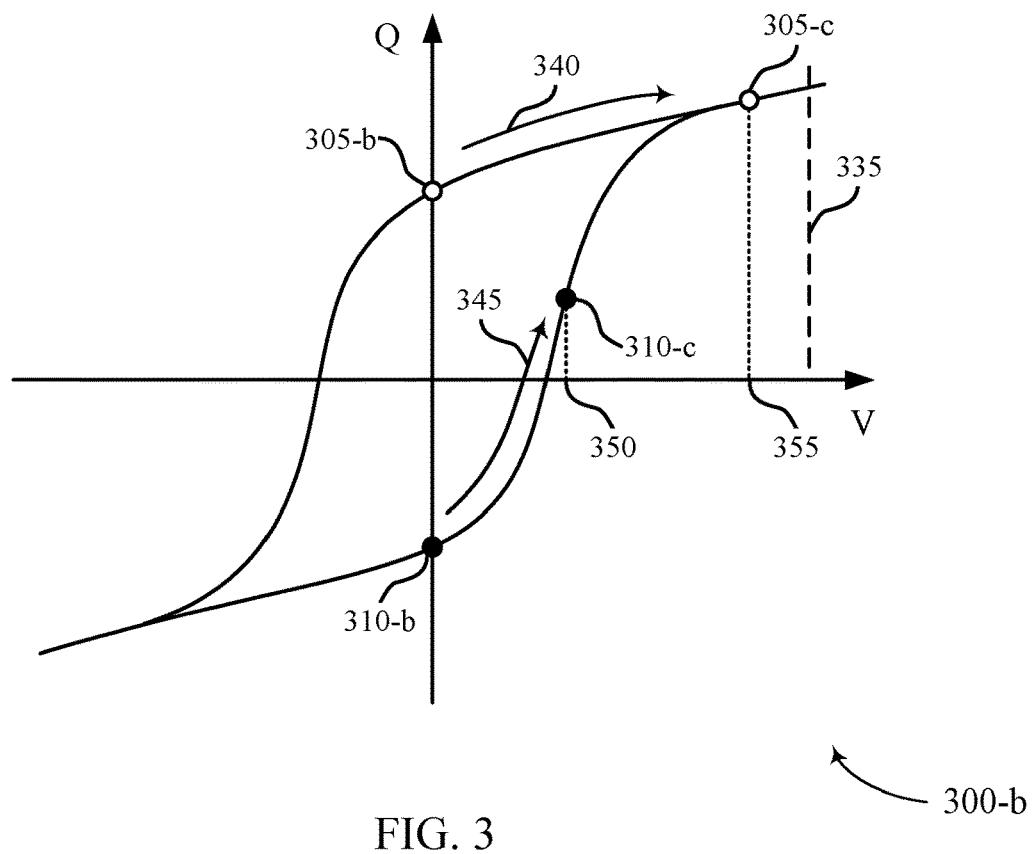

FIG. 3 illustrates an example of non-linear electrical properties with hysteresis curves 300-a and 300-b for a ferroelectric memory cell that supports sensing a memory cell in accordance with aspects of the present disclosure. Hysteresis curves 300-a and 300-b illustrate an example ferroelectric memory cell writing and reading process, respectively. Hysteresis curves 300 depict the charge, Q, stored on a ferroelectric capacitor (e.g., capacitor 205 of FIG. 2) as a function of a voltage difference, V.

A ferroelectric material is characterized by a spontaneous electric polarization, i.e., it maintains a non-zero electric polarization in the absence of an electric field. Example ferroelectric materials include barium titanate ($BaTiO_3$), lead titanate ($PbTiO_3$), lead zirconium titanate (PZT), and strontium bismuth tantalate (SBT). The ferroelectric capacitors described herein may include these or other ferroelectric materials. Electric polarization within a ferroelectric capacitor results in a net charge at the ferroelectric material's surface and attracts opposite charge through the capacitor terminals. Thus, charge is stored at the interface of the ferroelectric material and the capacitor terminals. Because the electric polarization may be maintained in the absence of an externally applied electric field for relatively long times, even indefinitely, charge leakage may be significantly decreased as compared with, for example, capacitors employed in DRAM arrays. This may reduce the need to perform refresh operations as described above for some DRAM architectures.

Hysteresis curves 300-a and 300-b may be understood from the perspective of a single terminal of a capacitor. By way of example, if the ferroelectric material has a negative polarization, positive charge accumulates at the terminal. Likewise, if the ferroelectric material has a positive polarization, negative charge accumulates at the terminal. Additionally, it should be understood that the voltages in hysteresis curves 300 represent a voltage difference across the capacitor and are directional. For example, a positive voltage may be realized by applying a positive voltage to the terminal in question (e.g., a cell plate 230) and maintaining the second terminal (e.g., a cell bottom 215) at ground (or approximately zero volts (0V)). A negative voltage may be applied by maintaining the terminal in question at ground and applying a positive voltage to the second terminal—i.e., positive voltages may be applied to negatively polarize the terminal in question. Similarly, two positive voltages, two negative voltages, or any combination of positive and negative voltages may be applied to the appropriate capacitor terminals to generate the voltage difference shown in hysteresis curves 300-a and 300-b.

As depicted in hysteresis curve 300-a, the ferroelectric material may maintain a positive or negative polarization with a zero voltage difference, resulting in two possible charged states: charge state 305 and charge state 310. According to the example of FIG. 3, charge state 305 represents a logic 0 and charge state 310 represents a logic 1. In some examples, the logic values of the respective charge states may be reversed to accommodate other schemes for operating a memory cell.

A logic 0 or 1 may be written to the memory cell by controlling the electric polarization of the ferroelectric material, and thus the charge on the capacitor terminals, by applying voltage. For example, applying a net positive voltage 315 across the capacitor results in charge accumulation until charge state 305-a is reached. Upon removing voltage 315, charge state 305-a follows path 320 until it reaches charge state 305 at zero voltage. Similarly, charge state 310 is written by applying a net negative voltage 325, which results in charge state 310-a. After removing negative voltage 325, charge state 310-a follows path 330 until it reaches charge state 310 at zero voltage. Charge states 305-a and 310-a may also be referred to as the remnant polarization (Pr) values, i.e., the polarization (or charge) that remains upon removing the external bias (e.g., voltage). The coercive voltage is the voltage at which the charge (or polarization) is zero.

To read, or sense, the stored state of the ferroelectric capacitor, a voltage may be applied across the capacitor. In response, the stored charge, Q, changes, and the degree of the change depends on the initial charge state—i.e., the final stored charge (Q) depends on whether charge state 305-b or 310-b was initially stored. For example, hysteresis curve 300-b illustrates two possible stored charge states 305-b and 310-b. Voltage 335 may be applied across the capacitor as discussed with reference to FIG. 2. In other cases, a fixed voltage may be applied to the cell plate and, although depicted as a positive voltage, voltage 335 may be negative. In response to voltage 335, charge state 305-b may follow path 340. Likewise, if charge state 310-b was initially stored, then it follows path 345. The final position of charge state 305-c and charge state 310-c depend on a number of factors, including the specific sensing scheme and circuitry.

In some cases, the final charge may depend on the intrinsic capacitance of the digit line connected to the memory cell. For example, if the capacitor is electrically connected to the digit line and voltage 335 is applied, the voltage of the digit line may rise due to its intrinsic capacitance. So a voltage measured at a sense component may not be equal to voltage 335 and instead may depend on the voltage of the digit line. In some cases, the digit line may be precharged before the capacitor is electrically connected to the digit line during a read operation. The position of final charge states 305-c and 310-c on hysteresis curve 300-b may thus depend on the capacitance of the digit line and may be determined through a load-line analysis—i.e., charge states 305-c and 310-c may be defined with respect to the digit line capacitance. As a result, the voltage of the capacitor, voltage 350 or voltage 355, may be different and may depend on the initial state of the capacitor.

By comparing the digit line voltage to a reference voltage, the initial state of the capacitor may be determined. The digit line voltage may be the difference between voltage 335 and the final voltage across the capacitor, voltage 350 or voltage 355—i.e., (voltage 335-voltage 350) or (voltage 335-voltage 355). A reference voltage may be generated such that its magnitude is between the two possible voltages of the two possible digit line voltages in order to determine the stored logic state—i.e., if the digit line voltage is higher or lower than the reference voltage. For example, the reference voltage may be an average of the two quantities, (voltage 335-voltage 350) and (voltage 335-voltage 355). Upon comparison by the sense component, the sensed digit line voltage may be determined to be higher or lower than the reference voltage, and the stored logic value of the ferroelectric memory cell (i.e., a logic 0 or 1) may be determined.

In some cases, a circuit positioned between the digit line and the sense component may be configured to reduce the digit line voltage to a second voltage that is within an operation voltage of the sense component. In some cases, the sense component may include various transistors and amplifiers fabricated using a thin gate oxide to reduce power consumption and to improve sensing characteristics. In some cases, a first switching component of the circuit is configured to selectively couple the sense component with the digit line based on a logic state stored on the ferroelectric memory cell. In addition, a second switching component of the circuit may be configured to limit (e.g., reduce, down convert) the digit line voltage to the second voltage.

As discussed above, reading a memory cell that does not use a ferroelectric capacitor may degrade or destroy the stored logic state. A ferroelectric memory cell, however, may maintain the initial logic state after a read operation. For example, if charge state 305-b is stored, the charge state may follow path 340 to charge state 305-c during a read operation and, after removing voltage 335, the charge state may return to initial charge state 305-b by following path 340 in the opposite direction.

Figure 4:
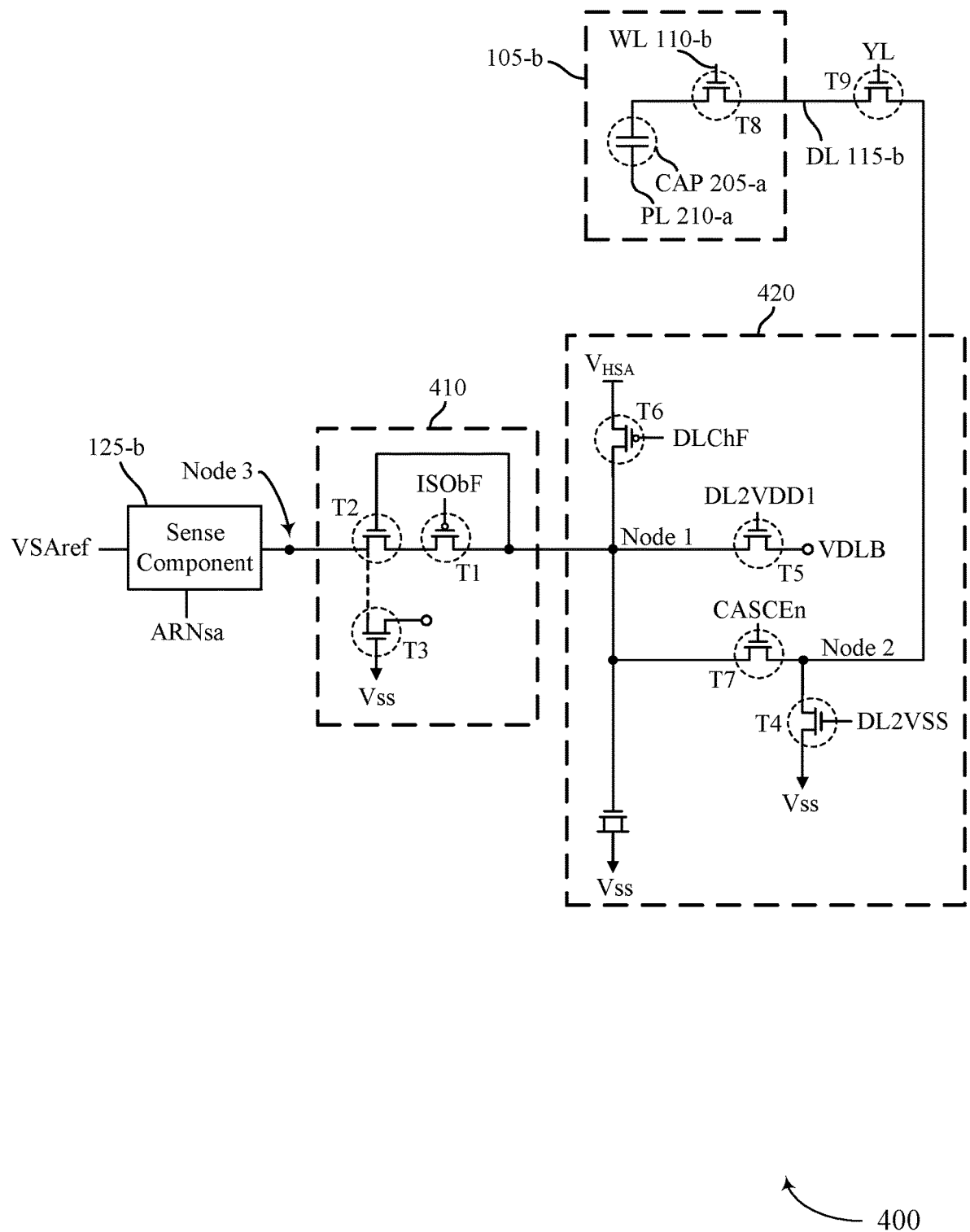
FIG. 4 illustrates an example of a circuit that supports sensing a memory cell in accordance with aspects of the present disclosure.

FIG. 4 illustrates an example of a circuit 400 that supports sensing a memory cell in accordance with aspects of the present disclosure. The circuit 400 illustrates a simplified circuit configuration to highlight several circuit components collaborating to facilitate sensing of a memory cell. The circuit 400 includes a down-conversion circuit 410, which is positioned between sense component 125-b and another sense circuit 420. Sense component 125-b may be an example of or some portion of the sense component 125 or 125-a described with reference to FIGS. 1 and 2. In addition, sense circuit 420 may be configured to couple with memory cell 105-b. Memory cell 105-b may be an example of the memory cell 105 or 105-a described with reference to FIG. 1 or 2. Circuit 400 may be configured to sense a logic state stored on the memory cell 105-a during a read operation as described with reference to FIG. 5.

Down-conversion circuit 410 may be configured to limit a voltage of a charge transferred between the memory cell 105-b and the sense component 125-b during a read operation. Further, down-conversion circuit 410 may be configured to selectively couple the memory cell 105-b with the sense component 125-b (e.g., through Node 1) based on a logic state stored on the memory cell 105-b. Such a selective coupling between the memory cell 105-b and the sense component 125-b may improve a sensing operation of a memory device including the circuit 400—e.g., a larger sensing margin, a faster sensing operation, a less power consumption during a read operation. In some cases, the down-conversion circuit 410 may be referred to as a circuit.

Down-conversion circuit 410 may include T1 (e.g., a first switching component) and T2 (e.g., a second switching component). T1 may be a p-type metal oxide semiconductor (PMOS) field effect transistor (FET) and T2 may be an n-type metal oxide semiconductor (NMOS) field effect transistor (FET). In some cases, the PMOS FET and the NMOS FET may be arranged in a serial configuration. Further, T1 may be coupled with Node 1 (e.g., a first node), and T2 may be coupled with T1 and the sense component 125-b, where a gate of T2 is coupled with Node 1 (e.g., the first node). As such, sense circuit 420 may be configured to limit a voltage of a charge that is transferred between the memory cell 105-b and the sense component 125-b during a read operation. In some cases, the sense circuit 420 may be referred to as a circuit.

Operation of T1 (e.g., activate or deactivate) may be determined by a threshold voltage of T1, a voltage applied to a gate of T1 (i.e., ISObF), a voltage at Node 1, or a combination thereof. T1 may be configured to have a particular threshold voltage. In addition, voltage magnitudes associated with ISObF (e.g., the voltage applied to the gate of T1) may be configured to selectively turn on (e.g., activate) T1, in conjunction with the particular threshold voltage of T1, depending on a voltage established at Node 1 during a read operation. During the read operation, the memory cell 105-b may be coupled with Node 1, and different voltages may be established at Node 1 based on a logic state stored on the memory cell 105-b. In this manner, T1 may selectively turn on (e.g., activate) to couple the memory cell 105-b with the sense component 125-b based on the logic state stored on the memory cell 105-b. For example, T1 may be configured to activate when a first voltage is applied to the gate of T1 and a second voltage (e.g., a charge indicative of a high-logic state being stored on the memory cell 105-b) is applied to a node of T1. In addition, T1 may be configured to remain deactivated when the first voltage is applied to the gate of T1 and a third voltage (e.g., a charge indicative of a low-logic state being stored on the memory cell 105-b) less than the second voltage is applied to the node of T1.

Operation of T2 may be determined by a threshold voltage of T2 and a voltage applied to a gate of T2. The voltage applied to the gate of T2 corresponds to a voltage at Node 1 because the gate of T2 is electrically connected to Node 1. Operation of T2 may be described as that of an NMOS FET in a source-follower configuration. Namely, T2 may activate when the voltage applied to the gate of T2 (e.g., the voltage at Node 1) is greater than the threshold voltage of T2. In other words, T2 may limit (e.g., reduce, down convert) a voltage at Node 1 when both T1 and T2 are activated such that a voltage at Node 3 may be less than the voltage at Node 1 by at least T2's threshold voltage. The threshold voltage of T2 may be configured such that the voltage at Node 3 is within an operation voltage of the sense component 125-b.

In some cases, the sense component 125-b is configured to operate at a first voltage that is lower than a second voltage at which the memory cell 105-b is configured to operate.

T1 may selectively activate to couple the memory cell 105-b (e.g., through Node 1) with the sense component 125-b based on a logic state stored on the memory cell 105-b—e.g., T1 may activate when the memory cell 105-b stores a "high" logic state (e.g., logic state "1") while T1 may remain deactivated when the memory cell 105-b stores a "low" logic state (e.g., logic state "0"). Selective activation of T1 may improve a read voltage window (e.g., a sense window) of the sense component 125-b due to a larger difference in voltage levels associated with the logic states stored on the memory cell 105-b. In addition, when T1 is activated, T2 may limit (e.g., reduce, down convert) the voltage at Node 1 to a second voltage that may be suitable for the sense component 125-b to operate with.

In some cases, down-conversion circuit 410 may include T3 (e.g., a third switching component), which is represented with a dotted line connection to Node 3. Dotted line connection indicates that T3 may be an optional component. T3 may be coupled with the sense component 125-b and T2.

In some cases, a reference node (e.g., a node associated with VSAref signal) of the sense component 125-b may be coupled with an additional component (e.g., an NMOS FET) to provide a reliable reference voltage. A voltage at the reference node (e.g., VSAref signal) may be compared with a voltage at Node 3 (e.g., a signal voltage) to determine a logic state of a memory cell during a sensing operation. The reference node of the sense component 125-b may be an example of the node associated with the reference 225 described with reference to FIG. 2. In some cases, the additional component (e.g., an NMOS FET) at the reference node may introduce an additional parasitic element (e.g., a gate capacitance associated with the NMOS FET). Hence, T3 may be configured to match a load of the reference node (e.g., a capacitive load) of the sense component so as to facilitate a reliable and fast sensing operation.

In some cases, the voltage applied to the gate of T1 (e.g., ISObF) may be a constant voltage (e.g., a voltage between 0.6V and 1V) and the gate of T2 may be coupled to an enable signal (e.g., ISOa). During a portion of sensing operation (e.g., phase 6 described with reference to FIG. 5), the enable signal (e.g., ISOa) applied to the gate of T2 may toggle (e.g., transition from 0V to 1.5V, than back to 0V) to activate T2 instead of toggling the voltage applied to the gate of T1 (e.g., ISObF transitioning from $V_{HSA}$ to pPCASCEn, than back to $V_{HSA}$ during phase 6). As such, the voltage change associated with toggling the enable signal (e.g., ISOa) may be coupled to Node 3 as a coupling noise. In some cases, a gate of T3 may be coupled to another enabling signal (e.g., ISOaF), which may have an opposite polarity of the enabling signal (e.g., ISOa)—e.g., ISOaF transitioning from 1.5V to 0V, than back to 1.5V during the portion of sensing operation. T3 may be controlled by the other enabling signal (e.g., ISOaF) to dampen the coupling noise that may occur during the sensing operation.

The memory cell 105-b may include a selector device T8 and a capacitor (e.g., capacitor 205-a). In some cases, the capacitor (e.g., capacitor 205-a) may be an example of a ferroelectric capacitor. The selector device T8 may be an example of the selector device 220 described with reference to FIG. 2. capacitor 205-a may be an example of the capacitor 205 described with reference to FIG. 2. Further, the memory cell 105-b may be associated with a word line (WL) 110-b. The word line 110-b may be an example of the word line 110 described with reference to FIGS. 1 and 2. In some cases, capacitor 205-a may be a FeRAM capacitor of the memory cell 105 described with reference to FIGS. 1 and 2. capacitor 205-a may store a logic state (e.g., a logic state 1 or a logic state 0). During an access operation (e.g., a read operation to read the logic state stored on capacitor 205-a), word line 110-b may be biased (e.g., selected) to activate the selector device T8 such that capacitor 205-a may be coupled with digit line 115-b. digit line 115-b may be an example of the digit line 115 described with reference to FIGS. 1 and 2. A digit line selection signal (e.g., a voltage signal YL) may be applied to a gate of T9 to activate T9 such that digit line 115-b may be coupled to Node 2.

Sense circuit 420 may facilitate various timings of signals during a read operation. Sense circuit 420 may include transistors, T4 through T7. T4 may be configured to connect Node 2 to Vss as a response to DL2VSS (e.g., a voltage applied to a gate of T4). In some cases, Vss may represent 0V or a virtual ground. As a result of T4 connecting Node 2 to Vss, Node 2 (e.g., a digit line connected to Node 2) may be discharged to Vss (e.g., 0V). T5 may be configured to connect Node 1 to VDLB node as a response to DL2VDD1 (e.g., a voltage applied to a gate of T5). As a result of T5 connecting Node 1 to VDLB node, Node 1 may be pre-charged to a voltage level corresponding to that of VDLB node. T6 may be configured to connect Node 1 to $V_{HSA}$ as a response to DLChF (e.g., a voltage applied to a gate of T6). As a result of T6 connecting Node 1 to $V_{HSA}$, Node 1 may be precharged to $V_{HSA}$. In some cases, T5 may activate to precharge Node 1 to the voltage level of VDLB node, and then T6 may activate to further precharge Node 1 to $V_{HSA}$. T7 may be configured to connect Node 1 to Node 2 as a response to CASCEn (e.g., a voltage applied to a gate of T7). T7 may facilitate establishing different voltage levels at Node 1 and Node 2 during various phases of a read operation.

In some cases, the first switching component (e.g., T1) is configured to selectively couple the sense component (e.g., sense component 125-b) with the first node (e.g., Node 1) during the read operation based on a logic state stored on the memory cell (e.g., memory cell 105-b). In some cases, the first switching component is configured to selectively couple the sense component with the first node after the memory cell transfers a first charge indicative of a high logic state (e.g., logic state "1") to the first node. In some cases, the second switching component is configured to reduce the voltage associated with the charge for the sense component during the read operation.

In some cases, the first switching component comprises a p-type metal oxide semiconductor (PMOS) field effect transistor (FET) and the second switching component comprises an n-type metal oxide semiconductor (NMOS) field effect transistor (FET), and the PMOS FET and the NMOS FET are arranged in a serial configuration. In some cases, the PMOS FET is configured to selectively transfer, based at least in part on the logic state stored on the memory cell and a threshold voltage of the PMOS FET, the charge of the memory cell to the sense component in response to a second voltage being applied to a gate of the PMOS FET. In some cases, the PMOS FET, based at least in part on a second voltage applied to a gate of the PMOS FET, is configured to be activated when a third voltage is present at the first node and not to be activated when a fourth voltage is present at the first node. The third voltage at the first node may correspond to a high logic state of the memory cell, and the fourth voltage at the first node may correspond to a low logic state of the memory cell.

In some cases, the NMOS FET is configured as a source-follower to down convert the voltage associated with the charge to a second voltage that is within an operation voltage of the sense component, and the second voltage is lower than the voltage associated with the charge by an amount corresponding to a threshold voltage of the NMOS FET. In some cases, the circuit (e.g., down-conversion circuit 410) further includes a third switching component (e.g., T3) coupled with the sense component and the second switching component, where the third switching component is configured to dampen a coupling noise between the sense component and the second switching component. In some cases, the sense component is configured to operate at a first voltage that is lower than a second voltage at which the memory cell is configured to operate. In some cases, the circuit (e.g., down-conversion circuit 410) is configured to couple the sense component with the memory cell when the memory cell transfers a first charge indicative of a high logic state (e.g., logic state "1") to the first node during the read operation, and the circuit is configured to isolate the sense component from the memory cell when the memory cell transfers a second charge indicative of a low logic state (e.g., logic state "0") to the first node during the read operation.

Detail operations of the circuit 400, including operations of down-conversion circuit 410 and sense circuit 420 during various phases of a read operation, that supports sensing a memory cell is further illustrated as described with reference to FIG. 5.

Figure 5:
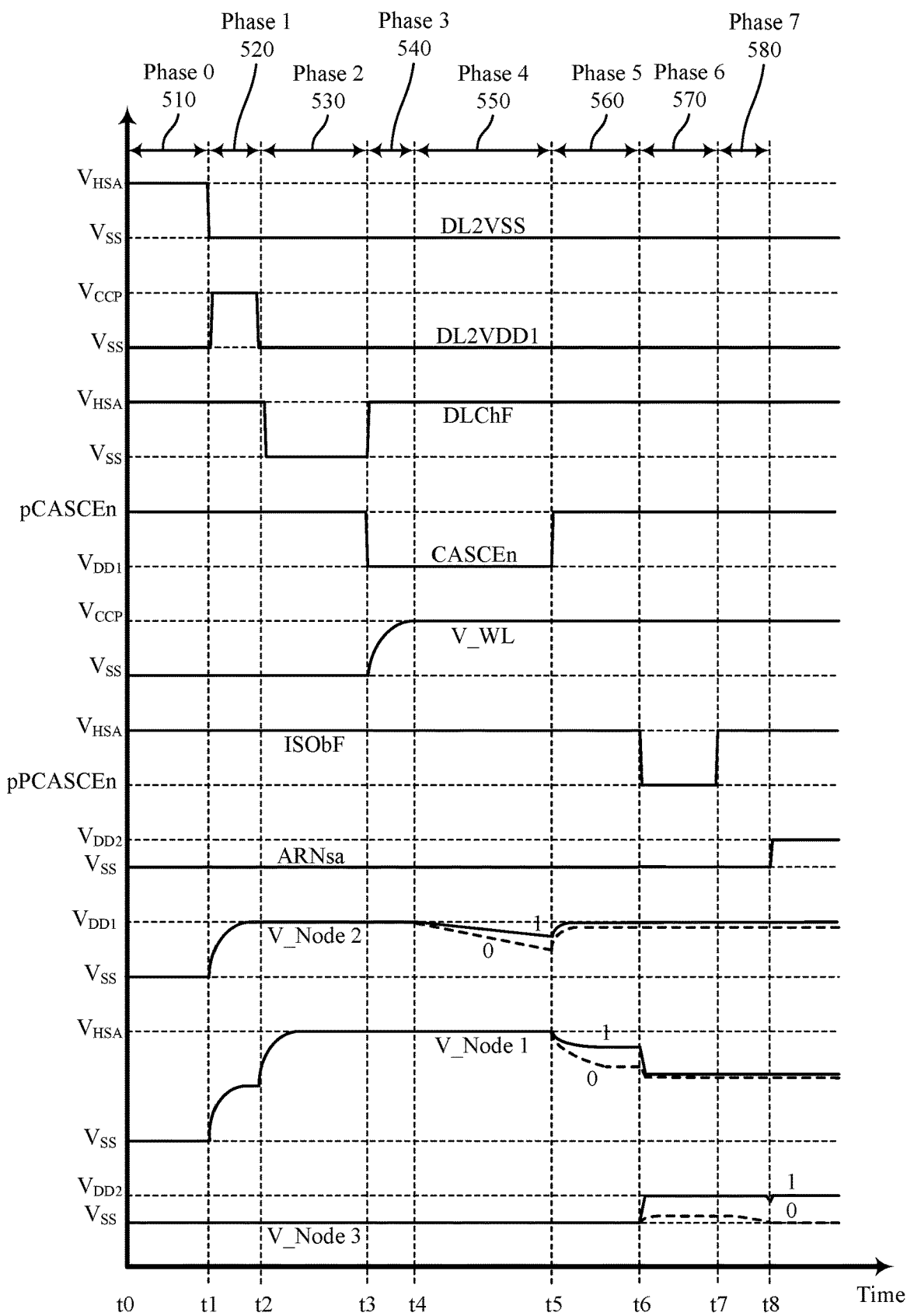
FIG. 5 illustrates an example of a timing diagram that supports sensing a memory cell in accordance with aspects of the present disclosure.

FIG. 5 illustrates an example of a timing diagram 500 that supports sensing a memory cell in accordance with aspects of the present disclosure. The timing diagram 500 illustrates procedures during a read operation to sense a logic state stored on a memory cell. The timing diagram 500 shows various voltage levels (e.g., voltage signals as a function of time) associated with the components and the nodes of the circuit 400 described with reference to FIG. 4 to illustrate how sensing a memory cell may be performed. The time and voltage scales used in FIG. 5 are for illustration purposes only, and may not precisely depict particular values in some cases. The timing diagram 500 includes a voltage applied to a gate of T4 (i.e., DL2VSS), a voltage applied to a gate of T5 (i.e., DL2VDD1), a voltage applied to a gate of T6 (i.e., DLChF), a voltage applied to a gate of T7 (i.e., CASCEn), a voltage applied to a gate of T1 (i.e., ISObF), a voltage applied to the sense component 125-b (e.g., ARNsa), a voltage associated with word line 110-b (i.e., V_WL), a voltage at Node 1 (i.e., V_Node 1), a voltage at Node 2 (i.e., V_Node 2), and a voltage at Node 3 (i.e., V_Node 3). In some cases, the voltage at Node 3 (i.e., V_Node 3) may correspond to a signal voltage of the sense component 125-b in comparison to a reference voltage (e.g., a reference voltage of VSAref signal) of the sense component 125-b.

During the initial phase 510 (e.g., phase 0), both Node 1 and Node 2 (e.g., digit line 115-b) may be discharged to Vss. In some cases, Vss corresponds to 0V or a virtual ground. During the initial phase 510, DL2VSS (e.g., voltage applied to the gate of T4) may be configured to be at $V_{HSA}$ to activate T4 such that T4 may discharge Node 2 to Vss. In some cases, $V_{HSA}$ may be between 2.5V and 3V. In addition, CASCEn (e.g., voltage applied to the gate of T7) may be configured to be at pCASCEn to activate T7. In some cases, pCASCEn may be between 2.5V and 3V. As a result of activating T7, T7 couples Node 2 with Node 1, and T4 may discharge Node 1 to Vss during the initial phase 510. The initial phase 510 may correspond to a time period between t0 and t1.

At time t1, the first phase 520 (e.g., phase 1) may begin where precharging the circuit 400 may begin. At t1, DL2VSS (e.g., voltage applied to the gate of T4) may be configured to reduce to Vss to deactivate T4 such that a voltage at Node 2 (e.g., voltage corresponding to digit line 115-b) may no longer be connected to Vss. During the first phase 520, T7 remains activated (e.g., CASCEn remains at pCASCEn) such that T7 couples Node 1 and Node 2. At time t1, DL2VDD1 (e.g., voltage applied to the gate of T5) may be configured to be at $V_{CCP}$ to activate T5. In some cases, $V_{CCP}$ may be in between 3.1V to 3.4V. As a result of activating T5, T5 precharges Node 1 (and Node 2 coupled with digit line 115-b) to a voltage level at VDLB node. In some cases, the voltage level at VDLB node corresponds to $V_{DD1}$, and $V_{DD1}$ may be in between 1.5 and 2 V. Thus, V_Node 2 (e.g., voltage at Node 2) may rise to $V_{DD1}$ during the first phase 520. At the same time, V_Node 1 (e.g., voltage at Node 1) may rise to $V_{DD1}$ as well. Hence, both Node 1 and Node 2 may be precharged to $V_{DD1}$ during the first phase 520. The first phase 520 may correspond to a time period between t1 and t2.

At time t2, the second phase 530 (e.g., phase 2) may begin where the precharging of the circuit 400 continues. At t2, DLChF (e.g., voltage applied to the gate of T6) may be configured to decrease to Vss from $V_{HSA}$ to activate T6. As a result of activating T6, T6 may further precharge Node 1 to $V_{HSA}$ from $V_{DD1}$ as illustrated in V_Node 1 (e.g., voltage at Node 1). In some cases, pCASCEn (e.g., a value of CASCEn, the voltage applied to the gate of T7) may be configured such that V_Node 2 (e.g., voltage at Node 2) may not exceed $V_{DD1}$ during phase 2. In some cases, as a result of activating T6, T6 may precharge a capacitor at Node 1 to $V_{HSA}$. During the second phase 530, a reference node (e.g., a node associated with VSAref signal) and a signal node (e.g., a node coupled with Node 3) of the sense component 125-b may also be discharged (e.g., refreshed). The second phase 530 may correspond to a time period between t2 and t3.

At time t3, the third phase 540 (e.g., phase 3) may begin where the word line 110-b may be biased to couple the memory cell 105-b with the sense circuit 420. At t3, the DLChF (e.g., voltage applied to the gate of T6) may be configured to go back to $V_{HSA}$ to deactivate T6. Hence, deactivated T6 isolates Node 1—which has been precharged to $V_{HSA}$ during the second phase 530—from $V_{HSA}$. In addition, the CASCEn may be reduced to $V_{DD1}$ at time t3. Further, word line 110-b may be biased to $V_{CCP}$ to activate T8. In some cases, word line 110-b may be associated with parasitic elements (e.g., a parasitic resistance and a parasitic capacitance, which in combination may result in a delay for V_WL to rise), and V_WL (e.g., the voltage associated with word line 110-b) may exhibit a rise time as illustrated in FIG. 5. In some cases, such a rise time may vary and may depend on a particular physical location of a memory cell from a word line driver (e.g., a word line driver associated with row decoder 120 described with reference to FIG. 1). V_WL may rise to $V_{CCP}$ toward the end of third phase 540. The third phase 540 may correspond to a time period between t3 and t4.

At time t4, the fourth phase 550 (e.g., phase 4) may begin where charging sharing between the memory cell 105-b and the rest of the circuit 400 may begin. At time t4, V_WL may reach $V_{CCP}$ to fully activate T8. As a result of activating T8, T8 may couple the capacitor 205-a with the digit line 115-b, which is coupled with Node 2 that has been precharged to $V_{DD1}$ during the first phase 520. Coupling the capacitor 205-a with the precharged DL 115-b may result in a reduction in the voltage at Node 2 (e.g., V_Node 2) due to a charge sharing between capacitor 205-a and the precharged digit line 115-*b*. Different voltages at Node 2 (e.g., V_Node 2) may develop based on a logic state stored on capacitor 205-*a* (e.g., memory cell 105-*b*) as a result of the charge sharing. In some cases, a "high" logic state (e.g., logic state "1") of capacitor 205-*a* may result in a voltage at Node 2 that is higher than another voltage at Node 2 corresponding to a "low" logic state (e.g., logic state "0") of capacitor 205-*a* at the end of the fourth phase 550 as illustrated in V_Node 2 (e.g., voltage associated with Node 2). During the fourth phase 550, T7 remains deactivated to isolated Node 2 from Node 1 such that the charge sharing (e.g., developing different voltages at Node 2 based on the logic state of capacitor 205-*a*) may be accomplished while Node 2 is isolated from Node 1. The fourth phase 550 may correspond to a time period between t4 and t5.

At time t5, the fifth phase 560 (e.g., phase 5) may begin and the charge at Node 2 may be shared with Node 1. At time t5, CASCEn (e.g., voltage applied to the gate of T7) may be configured to increase to pCASCEn to activate T7. As a result of activating T7, T7 may couple Node 1 and Node 2. Upon coupling Node 1 and Node 2, V_Node 1 (e.g., voltage at Node 1 or a voltage across the capacitor at Node 1 in some cases) may decrease while the V_Node 2 (e.g., voltage at Node 2) may increase close to $V_{DD1}$. Different voltages at Node 1 (e.g., V_Node 1) may develop based on different voltages at Node 2 (e.g., V_Node 2), which indicates the logic state stored on capacitor 205-*a* (e.g., memory cell 105-*b*). Thus, two distinct voltage values at Node 1 (e.g., V_Node 1) may develop at the end of the fifth phase 560, the two distinct voltage values at Node 1 corresponding to the logic states stored on capacitor 205-*a*. The fifth phase 560 may correspond to a time period between t5 and t6.

At time t6, the sixth phase 570 (e.g., phase 6) may begin and the sense component may sample the charge at Node 2 using the down-conversion circuit 410. At time t6, ISObF (e.g., voltage applied to the gate of T1) may be configured to decrease to pPCASCEn. In some cases, pPCASCEn may be between 0.6V and 1V. As discussed above with reference to FIG. 4, T1 may selectively activate to couple Node 1 with Node 3 (e.g., a signal node of sense component 125-*b*) based on the logic state stored on capacitor 205-*a*. In other words, T1 may activate when the memory cell 105-*b* stores a "high" logic state (e.g., logic state "1") while T1 may remain deactivated when the memory cell 105-*b* stores a "low" logic state (e.g., logic state "0"). Further, when T1 is activated, T2 may limit (e.g., reduce, down convert) the voltage at Node 1 to a second voltage (e.g., a voltage at Node 3) that may be suitable for the sense component 125-*b* to operate with. Thus, V_Node 3 (e.g., the voltage at Node 3, which is coupled with a signal node of sense component 125-*b*) established during the sixth phase 570 may represent a reduced (e.g., down-converted) voltage indicative of a particular logic state stored on capacitor 205-*a* (e.g., memory cell 105-*b*). V_Node 3 may correspond to $V_{DD2}$, which may be equal or less than an operation voltage of sense component 125-*b* when the logic state stored on capacitor 205-*a* corresponds to a "high" logic state (e.g., logic state "1"). In some cases, $V_{DD2}$ may be between 1V and 1.4V. The sixth phase 570 may correspond to a time period between t6 and t7.

In some cases, T1 may transfer a small amount of charge when the logic state stored on the memory cell 105-*b* (e.g., "low" logic state, logic state "0") may not fully activate T1. Such transfer of a small amount of charge may be originated from a normal process variations (e.g., variations in a threshold voltage of T1, variations in a capacitance value of capacitor 205-*a*, variations parasitic capacitances associated with digit line 115-*b*). The small amount of charge may result in a small rise in V_Node 3 as illustrated in FIG. 5. The rise in V_Node 3 corresponding to a logic state "0" may be insignificant during a latching operation (e.g., detecting and amplifying a difference in signals) to determine the logic state of the memory cell.

At time t7, the seventh phase 580 (e.g., phase 7) may begin. At time t7, ISObF (e.g., voltage applied to the gate of T1) may be configured to increase to $V_{HSA}$ to deactivate T1 after the V_Node 3 (e.g., voltage of Node 3) stabilizes. The seventh phase 580 may correspond to a time period between t7 and t8.

At time t8, a latching operation may begin (e.g., a latch may be fired) to compare the charge at Node 3 with a reference signal. At time t8, ARNsa (e.g., voltage applied to the sense component 125-*b*) may be configured to rise to $V_{DD2}$. In some cases, ARNsa may activate a portion of sense component 125-*b* to detect and amplify a voltage difference between V_Node 3 and a reference voltage (e.g., a reference voltage of VSAref signal) to determine the logic state stored on the memory cell 105-*b* (e.g., capacitor 205-*a*)—e.g., latching operation. In some cases, an interval between t7 and t8 may be very brief.

Figure 6:
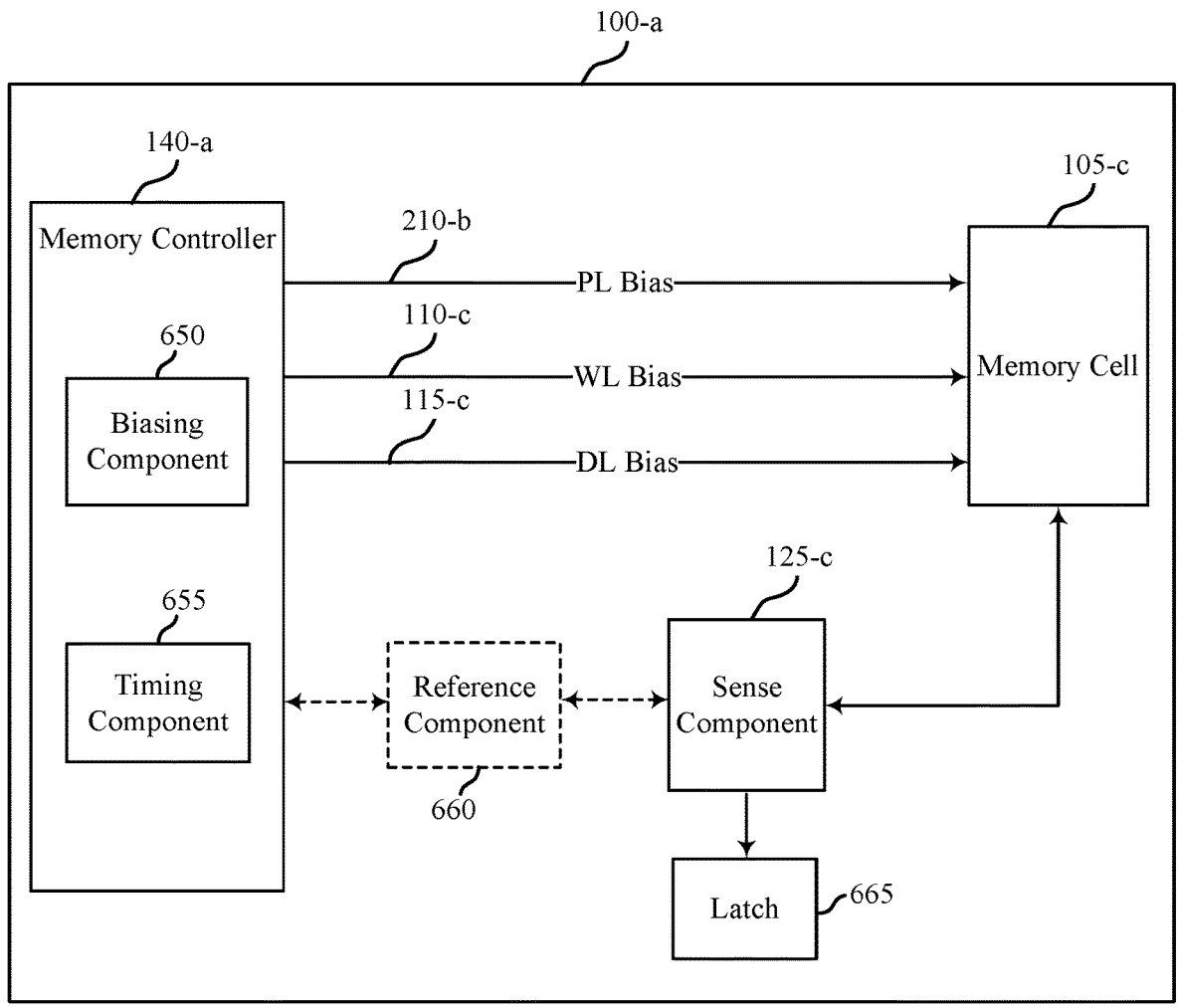
FIGS. 6 through 7 show block diagrams of a device that supports sensing a memory cell in accordance with aspects of the present disclosure.

FIG. 6 shows a block diagram 600 of a memory device that supports sensing a memory cell in accordance with aspects of the present disclosure. Memory array 100-*a* may be referred to as an electronic memory apparatus and includes memory controller 140-*a* and memory cell 105-*c*, which may be examples of memory controller 140 and memory cell 105 described with reference to FIG. 1. Memory controller 140-*a* may include a biasing component 650 and a timing component 655, and may operate the memory array 100-*a* as described with reference to FIG. 1. Memory controller 140-*a* may be in electronic communication with word line 110-*c*, digit line 115-*c*, plate line 210-*b*, and sense component 125-*c*, which may be examples of word line 110, digit line 115, plate line 210, and sense component 125 described with reference to FIGS. 1 through 4. Memory array 100-*a* may also include a reference component 660 and a latch 665. The components of memory array 100-*a* may be in electronic communication with each other and may perform the functions described with reference to FIGS. 1 through 5. In some cases, the reference component 660, the sense component 125-*c*, and the latch 665 may be components of memory controller 140-*a*.

Memory controller 140-*a* may be configured to activate word line 110-*c*, plate line 210-*b*, or digit line 115-*c* by applying voltages to those various nodes. For example, the biasing component 650 may be configured to apply a voltage to operate the memory cell 105-*b* to read or write memory cell 105-*b* as described above. In some cases, memory controller 140-*a* may include a row decoder, column decoder, or both, as described with reference to FIG. 1. This may enable the memory controller 140-*a* to access one or more memory cells 105. The biasing component 650 may also provide voltage potentials to the reference component 660 in order to generate a reference signal for sense component 125-*c*.

Additionally, the biasing component 650 may provide voltage potentials for the operation of the sense component 125-*c*. In some cases, the memory controller 140-*a* may control various phases of a read operation. In some cases, the memory controller 140-*a* may precharge the digit line 115-*c* during a read operation. In some cases, the memory controller 140-*a* may activate the word line 110-*c* to couple the memory cell 105-*c* with the digit line 115-*c* after precharging the digit line 115-*c*. In some cases, the memory controller 140-*a* may transfer, based at least in part on activating the word line 110-*c*, a charge between the memory cell 105-*c* and a sense component 125-*c* through a circuit configured to reduce a voltage associated with the charge during the read operation. In some cases, the memory controller 140-*a* may determine a logic state stored on the memory cell 105-*c* based at least in part on the charge transferred through the circuit.

In some cases, the memory controller 140-*a* may perform its operations using the timing component 655. For example, the timing component 655 may control the timing of the various word line selections, digit line selections, or plate line biasing, including timing for switching and voltage application to perform the memory functions, such as reading and writing, discussed herein. In some cases, the timing component 655 may control the operations of the biasing component 650.

In some cases, the memory array 100-*a* may include the reference component 660. The reference component 660 may include various components to generate a reference signal for the sense component 125-*c*. The reference component 660 may include circuitry configured to produce reference signals. In some cases, the reference component 660 may include other memory cells 105. In some examples, the reference component 660 may be configured to output a voltage with a value between the two sense voltages, as described with reference to FIG. 3. Or the reference component 660 may be designed to output a virtual ground voltage (i.e., approximately 0V).

The sense component 125-*c* may compare a signal from memory cell 105-*c* (through digit line 115-*c*) with a reference signal from the reference component 660. Upon determining the logic state, the sense component may then store the output in the latch 665, where it may be used in accordance with the operations of an electronic device that memory array 100-*a* is a part of. In some cases, the sense component 125-*b* may establish a second voltage (e.g., V_Node 3 after time t8 as described with reference to FIG. 5) at a second node (e.g., Node 3 described with reference to FIG. 4) associated with the sense component 125-*b*, where the second voltage is indicative of the logic state stored on the memory cell 105-*c*. In some cases, the sense component 125-*b* may be configured to operate at a first voltage that is lower than a second voltage at which the memory cell 105-*c* is configured to operate.

In some cases, the memory device, which may be referred to as an electronic memory device, may include a memory array including a memory cell coupled with a digit line and a word line and a controller coupled with the memory array. In some cases, the controller may be configured to precharge the digit line during a read operation, activate the word line to couple the memory cell with the digit line after precharging the digit line, transfer, based at least in part on activating the word line, a charge between the memory cell and a sense component through a circuit configured to reduce a voltage associated with the charge during the read operation, and determine a logic state stored on the memory cell based at least in part on the charge transferred through the circuit.

Figure 7:
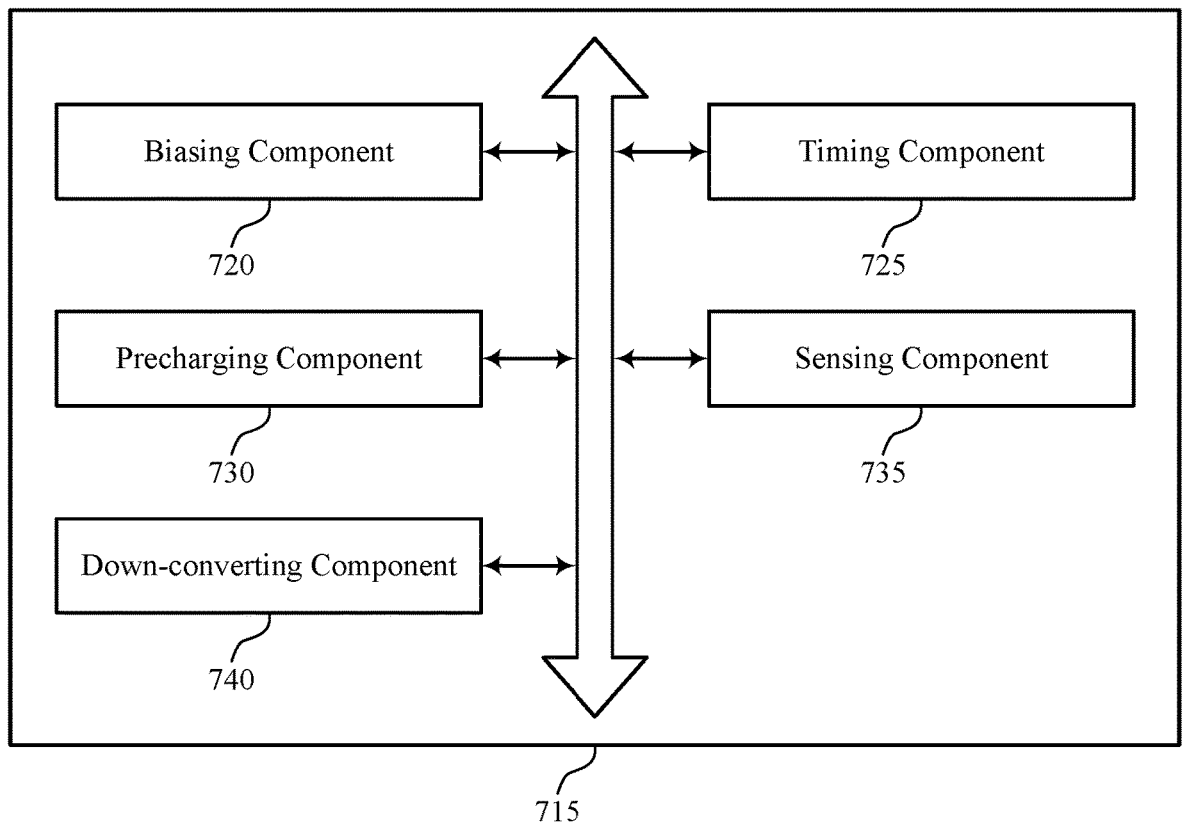

FIG. 7 shows a block diagram 700 of a memory controller 715 that supports sensing a memory cell in accordance with aspects of the present disclosure. The memory controller 715 may be an example of aspects of the memory controller 140 described with reference to FIGS. 1 and 6. The memory controller 715 may include a biasing component 720, a timing component 725, a precharging component 730, a sensing component 735, and a down-converting component 740. Each of these modules may communicate, directly or indirectly, with one another (e.g., via one or more buses).

The biasing component 720 may activate a word line to couple a memory cell with the digit line after precharging the digit line. In some cases, the biasing component 720 may bias a gate of a first switching component of the circuit to a second voltage based on coupling the digit line with a first node. In some cases, the biasing component 720 may activate the first switching component to couple the sense component with the first node based on biasing the gate of the first switching component to the second voltage when the memory cell stores a high logic state. In some cases, the biasing component 720 may isolate the digit line from the first node for a duration during the read operation based on precharging the first node to the first voltage, where activating the word line to couple the memory cell with the digit line is based on isolating the digit line from the first node. In some cases, the biasing component 720 may recouple the digit line with the first node after the duration during the read operation based on activating the word line, where transferring the charge between the memory cell and the sense component is based on recoupling the digit line with the first node. In some cases, the biasing component 720 may couple the digit line with a first node that has been precharged to a first voltage based on activating the word line, where transferring the charge between the memory cell and the sense component is based on coupling the digit line with the first node. In some cases, the biasing component 720 may couple the digit line with the first node establishes the voltage at the first node indicative of the logic state stored on the memory cell.

The precharging component 730 may precharge a digit line during a read operation. In some cases, the precharging component 730 may precharge a first node to a first voltage based on precharging the digit line.

The sensing component 735 may transfer, based on activating the word line, a charge between the memory cell and a sense component through a circuit configured to reduce a voltage associated with the charge during the read operation. In some cases, the sensing component 735 may determine a logic state stored on the memory cell based on the charge transferred through the circuit. In some cases, the sensing component 735 may maintain the first switching component in a deactivated state when the gate of the first switching component is biased to the second voltage when the memory cell stores a low logic state. In some cases, the sensing component 735 may activate the sense component based on transferring the charge between the memory cell and the sense component. In some cases, the sensing component 735 may establish a second voltage at a second node associated with the sense component based on activating the sense component, where the second voltage is indicative of the logic state stored on the memory cell.

In some cases, transferring the charge between the memory cell and the sense component through the circuit further includes activating the circuit to couple the sense component with the memory cell when the memory cell transfers a first charge indicative of a high logic state to a first node during the read operation. In some cases, determining the logic state stored on the memory cell further includes comparing a reduced voltage associated with the charge transferred through the circuit with a reference voltage of the sense component.

The down-converting component 740 may down convert, by a second switching component of the circuit, the voltage associated with the charge to a third voltage, where the third voltage is lower than the voltage associated with the charge by an amount corresponding to a threshold voltage of the second switching component. In some cases, the down-converting component 740 may down convert a voltage associated with the first charge for the sense component based on activating the circuit to couple the sense component with the memory cell.

Figure 8:
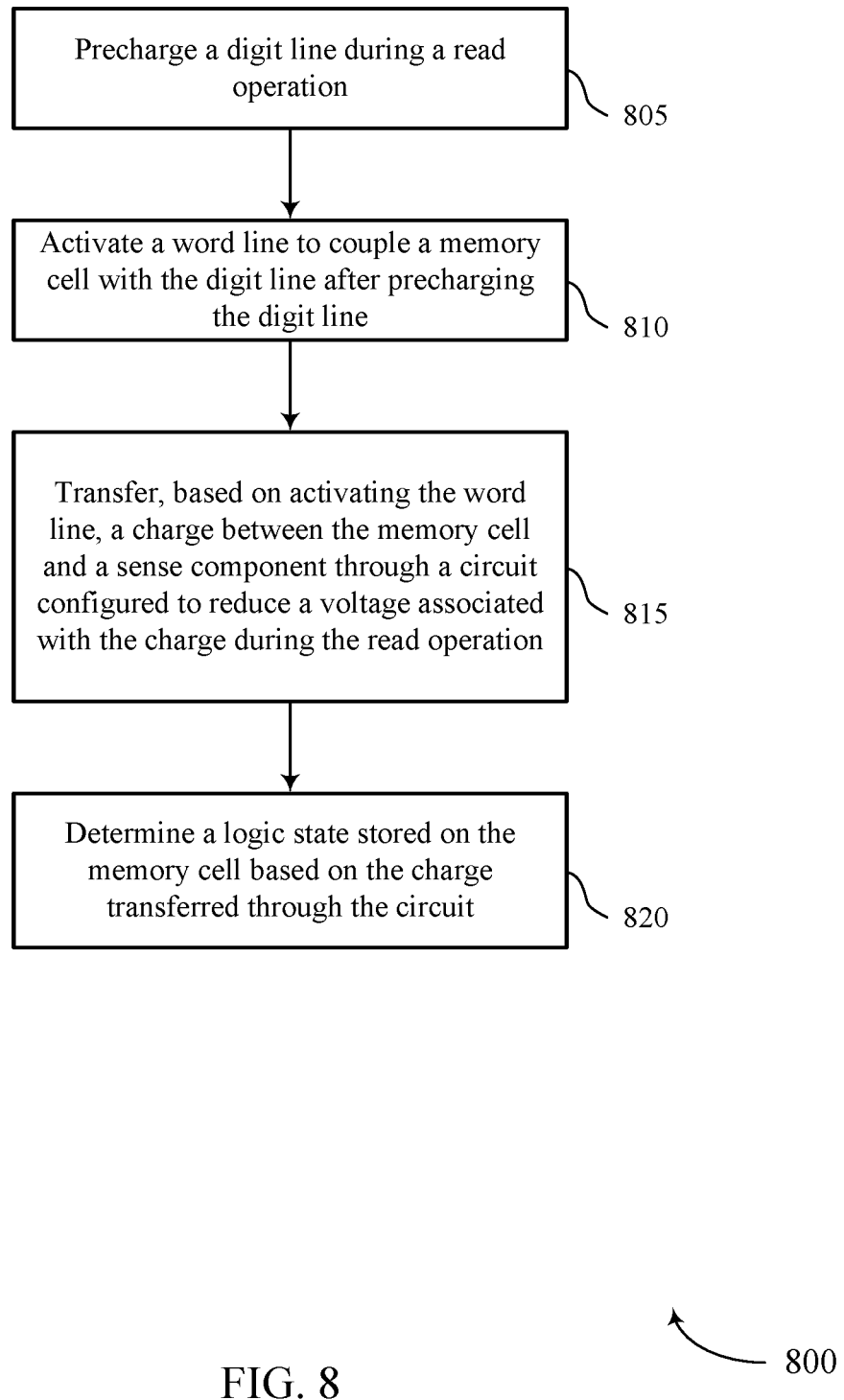
FIG. 8 illustrates a method for sensing a memory cell in accordance with aspects of the present disclosure.

FIG. 8 shows a flowchart illustrating a method 800 for sensing a memory cell in accordance with aspects of the present disclosure. The operations of method 800 may be implemented by a memory array 100 or its components as described herein. For example, the operations of method 800 may be performed by a memory controller as described with reference to FIGS. 1, 6, and 7. In some examples, a memory array 100 may execute a set of codes to control the functional elements of the device to perform the functions described below. Additionally or alternatively, the memory array 100 may perform aspects of the functions described below using special-purpose hardware.

At 805 the memory array 100 may precharge a digit line during a read operation. The operations of 805 may be performed according to the methods described herein. In certain examples, aspects of the operations of 805 may be performed by a precharging component as described with reference to FIGS. 6 and 7.

At 810 the memory array 100 may activate a word line to couple a memory cell with the digit line after precharging the digit line. The operations of 810 may be performed according to the methods described herein. In certain examples, aspects of the operations of 810 may be performed by a biasing component as described with reference to FIGS. 6 and 7.

At 815 the memory array 100 may transfer, based at least in part on activating the word line, a charge between the memory cell and a sense component through a circuit configured to reduce a voltage associated with the charge during the read operation. The operations of 815 may be performed according to the methods described herein. In certain examples, aspects of the operations of 815 may be performed by a sensing component as described with reference to FIG. 7.

At 820 the memory array 100 may determine a logic state stored on the memory cell based at least in part on the charge transferred through the circuit. The operations of 820 may be performed according to the methods described herein. In certain examples, aspects of the operations of 820 may be performed by a sensing component as described with reference to FIG. 7.

An apparatus for performing the method 800 is described. The apparatus may include means for precharging a digit line during a read operation, means for activating a word line to couple a memory cell with the digit line after precharging the digit line, means for transferring, based at least in part on activating the word line, a charge between the memory cell and a sense component through a circuit configured to reduce a voltage associated with the charge during the read operation, and means for determining a logic state stored on the memory cell based at least in part on the charge transferred through the circuit.

Another apparatus for performing the method 800 is described. The apparatus may include a memory cell and a memory controller in electronic communication with the memory cell, wherein the memory cell is operable to precharge a digit line during a read operation, activate a word line to couple a memory cell with the digit line after precharging the digit line, transfer, based at least in part on activating the word line, a charge between the memory cell and a sense component through a circuit configured to reduce a voltage associated with the charge during the read operation, and determine a logic state stored on the memory cell based at least in part on the charge transferred through the circuit.

Some examples of the method 800 and apparatus described above may further include processes, features, means, or instructions for biasing a gate of a first switching component of the circuit to a second voltage based at least in part on coupling the digit line with a first node. Some examples of the method 800 and apparatus described above may further include processes, features, means, or instructions for activating the first switching component to couple the sense component with the first node based at least in part on biasing the gate of the first switching component to the second voltage when the memory cell stores a high logic state.

Some examples of the method 800 and apparatus described above may further include processes, features, means, or instructions for down converting, by a second switching component of the circuit, the voltage associated with the charge to a third voltage, wherein the third voltage may be lower than the voltage associated with the charge by an amount corresponding to a threshold voltage of the second switching component.

Some examples of the method 800 and apparatus described above may further include processes, features, means, or instructions for maintaining the first switching component in a deactivated state when the gate of the first switching component may be biased to the second voltage when the memory cell stores a low logic state. In some examples of the method 800 and apparatus described above, transferring the charge between the memory cell and the sense component through the circuit may further include processes, features, means, or instructions for activating the circuit to couple the sense component with the memory cell when the memory cell transfers a first charge indicative of a high logic state to a first node during the read operation.

Some examples of the method 800 and apparatus described above may further include processes, features, means, or instructions for down converting a voltage associated with the first charge for the sense component based at least in part on activating the circuit to couple the sense component with the memory cell. In some examples of the method 800 and apparatus described above, determining the logic state stored on the memory cell may further include processes, features, means, or instructions for comparing a reduced voltage associated with the charge transferred through the circuit with a reference voltage of the sense component.

Some examples of the method 800 and apparatus described above may further include processes, features, means, or instructions for precharging a first node to a first voltage based at least in part on precharging the digit line. Some examples of the method 800 and apparatus described above may further include processes, features, means, or instructions for isolating the digit line from the first node for a duration during the read operation based at least in part on precharging the first node to the first voltage, wherein activating the word line to couple the memory cell with the digit line may be based at least in part on isolating the digit line from the first node.

Some examples of the method 800 and apparatus described above may further include processes, features, means, or instructions for recoupling the digit line with the first node after the duration during the read operation based at least in part on activating the word line, wherein transferring the charge between the memory cell and the sense component may be based at least in part on recoupling the digit line with the first node. Some examples of the method 800 and apparatus described above may further include processes, features, means, or instructions for coupling the digit line with a first node that may have been precharged to a first voltage based at least in part on activating the word line, wherein transferring the charge between the memory cell and the sense component may be based at least in part on coupling the digit line with the first node.

Some examples of the method 800 and apparatus described above may further include processes, features, means, or instructions for coupling the digit line with the first node establishes the voltage at the first node indicative of the logic state stored on the memory cell. Some examples of the method 800 and apparatus described above may further include processes, features, means, or instructions for activating the sense component based at least in part on transferring the charge between the memory cell and the sense component. Some examples of the method 800 and apparatus described above may further include processes, features, means, or instructions for establishing a second voltage at a second node associated with the sense component based at least in part on activating the sense component, wherein the second voltage may be indicative of the logic state stored on the memory cell.

It should be noted that the methods described above describe possible implementations, and that the operations and the steps may be rearranged or otherwise modified and that other implementations are possible. Furthermore, features from two or more of the methods may be combined.

A device is described. The device may include a memory cell configured to store a logic state, a sense component configured to determine the logic state stored on the memory cell during a read operation, and a circuit including a first switching component coupled with a first node and a second switching component coupled with the first switching component and the sense component, where a gate of the second switching component is coupled with the first node, the circuit configured to limit a voltage of a charge transferred between the memory cell and the sense component during the read operation.

In some examples, the first switching component is configured to selectively couple the sense component with the first node during the read operation based at least in part on the logic state stored on the memory cell. In some examples, the first switching component is configured to selectively couple the sense component with the first node after the memory cell transfers a first charge indicative of a high logic state to the first node. In some examples, the second switching component is configured to reduce the voltage associated with the charge for the sense component during the read operation.

In some examples, the first switching component comprises a PMOS FET and the second switching component comprises an NMOS FET, and the PMOS FET and the NMOS FET are arranged in a serial configuration. In some examples, the PMOS FET is configured to selectively transfer, based at least in part on the logic state stored on the memory cell and a threshold voltage of the PMOS FET, the charge of the memory cell to the sense component in response to a second voltage being applied to a gate of the PMOS FET.

In some examples, the PMOS FET, based at least in part on a second voltage applied to a gate of the PMOS FET, is configured to be activated when a third voltage is present at the first node and not to be activated when a fourth voltage is present at the first node, and the third voltage at the first node corresponds to a high logic state of the memory cell and the fourth voltage at the first node corresponds to a low logic state of the memory cell. In some examples, the NMOS FET is configured as a source-follower to down convert the voltage associated with the charge to a second voltage that is within an operation voltage of the sense component, and the second voltage is lower than the voltage associated with the charge by an amount corresponding to a threshold voltage of the NMOS FET.

In some examples, the circuit further comprises a third switching component coupled with the sense component and the second switching component, where the third switching component is configured to dampen a coupling noise between the sense component and the second switching component. In some examples, the sense component is configured to operate at a first voltage that is lower than a second voltage at which the memory cell is configured to operate. In some examples, the circuit is configured to couple the sense component with the memory cell when the memory cell transfers a first charge indicative of a high logic state to the first node during the read operation, and the circuit is configured to isolate the sense component from the memory cell when the memory cell transfers a second charge indicative of a low logic state to the first node during the read operation.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

As used herein, the term "virtual ground" refers to a node of an electrical circuit that is held at a voltage of approximately zero volts (0V) but that is not directly connected with ground. Accordingly, the voltage of a virtual ground may temporarily fluctuate and return to approximately 0V at steady state. A virtual ground may be implemented using various electronic circuit elements, such as a voltage divider consisting of operational amplifiers and resistors. Other implementations are also possible. "Virtual grounding" or "virtually grounded" means connected to approximately 0V.

The term "electronic communication" and "coupled" refer to a relationship between components that support electron flow between the components. This may include a direct connection between components or may include intermediate components. Components in electronic communication or coupled to one another may be actively exchanging electrons or signals (e.g., in an energized circuit) or may not be actively exchanging electrons or signals (e.g., in a de-energized circuit) but may be configured and operable to exchange electrons or signals upon a circuit being energized. By way of example, two components physically connected via a switch (e.g., a transistor) are in electronic communication or may be coupled regardless of the state of the switch (i.e., open or closed).

As used herein, the term "substantially" means that the modified characteristic (e.g., a verb or adjective modified by the term substantially) need not be absolute but is close enough so as to achieve the advantages of the characteristic.

As used herein, the term "electrode" may refer to an electrical conductor, and in some cases, may be employed as an electrical contact to a memory cell or other component of a memory array. An electrode may include a trace, wire, conductive line, conductive layer, or the like that provides a conductive path between elements or components of memory array 100.

The term "isolated" refers to a relationship between components in which electrons are not presently capable of flowing between them; components are isolated from each other if there is an open circuit between them. For example, two components physically connected by a switch may be isolated from each other when the switch is open.

As used herein, the term "shorting" refers to a relationship between components in which a conductive path is established between the components via the activation of a single intermediary component between the two components in question. For example, a first component shorted to a second component may exchange electrons with the second component when a switch between the two components is closed. Thus, shorting may be a dynamic operation that enables the flow of charge between components (or lines) that are in electronic communication.

The devices discussed herein, including memory array 100, may be formed on a semiconductor substrate, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOS), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A transistor or transistors discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details for the purpose of providing an understanding of the described techniques. These techniques, however, may be practiced without these specific details. In some instances, well-known structures and devices are shown in block diagram form in order to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a digital signal processor (DSP) and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be readily apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A method, comprising:
   precharging a digit line during a read operation;
   activating a word line to couple a memory cell with the digit line after precharging the digit line;
   transferring, based at least in part on activating the word line, a charge between the memory cell and a sense component through a circuit configured to reduce a voltage associated with the charge during the read operation; and
   determining a logic state stored on the memory cell based at least in part on the charge transferred through the circuit.

2. The method of claim 1, further comprising:
   biasing a gate of a first switching component of the circuit to a second voltage based at least in part on coupling the digit line with a first node.

3. The method of claim 2, further comprising:
   activating the first switching component to couple the sense component with the first node based at least in part on biasing the gate of the first switching component to the second voltage when the memory cell stores a high logic state.

4. The method of claim 3, further comprising:
   down converting, by a second switching component of the circuit, the voltage associated with the charge to a third voltage, wherein the third voltage is lower than the voltage associated with the charge by an amount corresponding to a threshold voltage of the second switching component.

5. The method of claim 2, further comprising:
   maintaining the first switching component in a deactivated state when the gate of the first switching component is biased to the second voltage when the memory cell stores a low logic state.

6. The method of claim 1, wherein transferring the charge between the memory cell and the sense component through the circuit further comprises:
   activating the circuit to couple the sense component with the memory cell when the memory cell transfers a first charge indicative of a high logic state to a first node during the read operation.

7. The method of claim 6, further comprising:
   down converting a voltage associated with the first charge for the sense component based at least in part on activating the circuit to couple the sense component with the memory cell.

8. The method of claim 1, wherein determining the logic state stored on the memory cell further comprises:
   comparing a reduced voltage associated with the charge transferred through the circuit with a reference voltage of the sense component.

9. The method of claim 1, further comprising:
   precharging a first node to a first voltage based at least in part on precharging the digit line; and
   isolating the digit line from the first node for a duration during the read operation based at least in part on precharging the first node to the first voltage, wherein activating the word line to couple the memory cell with the digit line is based at least in part on isolating the digit line from the first node.

10. The method of claim 9, further comprising:
    recoupling the digit line with the first node after the duration during the read operation based at least in part on activating the word line, wherein transferring the charge between the memory cell and the sense component is based at least in part on recoupling the digit line with the first node.

11. The method of claim 1, further comprising:
    coupling the digit line with a first node that has been precharged to a first voltage based at least in part on activating the word line, wherein transferring the charge between the memory cell and the sense component is based at least in part on coupling the digit line with the first node.

12. The method of claim 11, wherein coupling the digit line with the first node establishes the voltage at the first node indicative of the logic state stored on the memory cell.

13. The method of claim 1, further comprising:
    activating the sense component based at least in part on transferring the charge between the memory cell and the sense component; and
    establishing a second voltage at a second node associated with the sense component based at least in part on activating the sense component, wherein the second voltage is indicative of the logic state stored on the memory cell.

14. An apparatus, comprising:
    a memory array comprising a memory cell coupled with a digit line and a word line; and
    a controller coupled with the memory array and operable to cause the apparatus to:
       precharge the digit line during a read operation;
       activate the word line to couple the memory cell with the digit line after precharging the digit line;
       transfer, based at least in part on activating the word line, a charge between the memory cell and a sense component through a circuit configured to reduce a voltage associated with the charge during the read operation; and determine a logic state stored on the memory cell based at least in part on the charge transferred through the circuit.

15. The apparatus of claim 14, wherein the controller is further operable to cause the apparatus to:
bias a gate of a first switching component of the circuit to a second voltage based at least in part on coupling the digit line with a first node.

16. The apparatus of claim 15, wherein the controller is further operable to cause the apparatus to:
activate the first switching component to couple the sense component with the first node based at least in part on biasing the gate of the first switching component to the second voltage when the memory cell stores a high logic state.

17. The apparatus of claim 16, wherein the controller is further operable to cause the apparatus to:
down convert, by a second switching component of the circuit, the voltage associated with the charge to a third voltage, wherein the third voltage is lower than the voltage associated with the charge by an amount corresponding to a threshold voltage of the second switching component.

18. The apparatus of claim 15, wherein the controller is further operable to cause the apparatus to:
maintain the first switching component in a deactivated state when the gate of the first switching component is biased to the second voltage when the memory cell stores a low logic state.

19. The apparatus of claim 14, wherein, to transfer the charge between the memory cell and the sense component through the circuit, the controller is further operable to cause the apparatus to:
activate the circuit to couple the sense component with the memory cell when the memory cell transfers a first charge indicative of a high logic state to a first node during the read operation.

20. An apparatus, comprising:
a digit line configured to be precharged during a read operation;
a word line configured to be activated to couple a memory cell with the digit line after precharging the digit line; and
a circuit configured to transfer, based at least in part on activating the word line, a charge between the memory cell and a sense component, the circuit further configured to reduce a voltage associated with the charge during the read operation, wherein the sense component is configured to determine a logic state stored on the memory cell based at least in part on the charge transferred through the circuit.

* * * * *